(12) United States Patent
Yanagidaira et al.

(10) Patent No.: US 7,889,565 B2
(45) Date of Patent: Feb. 15, 2011

(54) NONVOLATILE SEMICONDUCTOR MEMORY DEVICE AND CONTROL METHOD

(75) Inventors: Kosuke Yanagidaira, Fujisawa (JP); Toshihiro Suzuki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 12/407,977

(22) Filed: Mar. 20, 2009

(65) Prior Publication Data
US 2009/0237993 A1 Sep. 24, 2009

(30) Foreign Application Priority Data
Mar. 21, 2008 (JP) ............... 2008-072929

(51) Int. Cl.
*G11C 16/04* (2006.01)
(52) U.S. Cl. .............. 365/185.22; 365/185.03; 365/185.18
(58) Field of Classification Search ............ 365/185.22, 365/185.03, 185.18
See application file for complete search history.

(56) References Cited

U.S. PATENT DOCUMENTS

| 6,487,115 | B1 | 11/2002 | Tsuruda |
| 6,639,837 | B2 * | 10/2003 | Takano et al. ............ 365/185.2 |
| 6,643,188 | B2 | 11/2003 | Tanaka et al. |
| 6,657,891 | B1 | 12/2003 | Shibata et al. |
| 6,868,007 | B2 * | 3/2005 | Hasegawa et al. ...... 365/185.09 |
| 6,937,522 | B2 * | 8/2005 | Funaki ................... 365/185.22 |
| 7,177,199 | B2 | 2/2007 | Chen et al. |
| 7,492,641 | B2 | 2/2009 | Hosono et al. |
| 2007/0183210 | A1 | 8/2007 | Choi et al. |

FOREIGN PATENT DOCUMENTS

| JP | 2003-196988 | 7/2003 |
| JP | 2004-192789 | 7/2004 |
| JP | 2005-129194 | 5/2005 |
| JP | 2007-4861 | 1/2007 |

* cited by examiner

*Primary Examiner*—Pho M Luu
(74) *Attorney, Agent, or Firm*—Oblon, Spivak, McClelland, Maier & Neustadt, L.L.P.

(57) ABSTRACT

A nonvolatile semiconductor memory device includes a plurality of memory cells, a read/program circuit which supplies a program voltage and a program verification voltage to the plurality of memory cells and desired data is programmed, supplies a first program verification voltage to the plurality of memory cells and then supplies a second program verification voltage to the plurality of memory cells when programming the data, and a read/program control circuit which determines memory cells which reach a first data program state and memory cells which do not reach the first data program state when supplying the first program verification voltage, and determines memory cells which reach a second data program state and memory cells which do not reach the second data program state when supplying the second program verification voltage, and supplies a program control voltage which changes the program operation state for each memory cell.

20 Claims, 15 Drawing Sheets

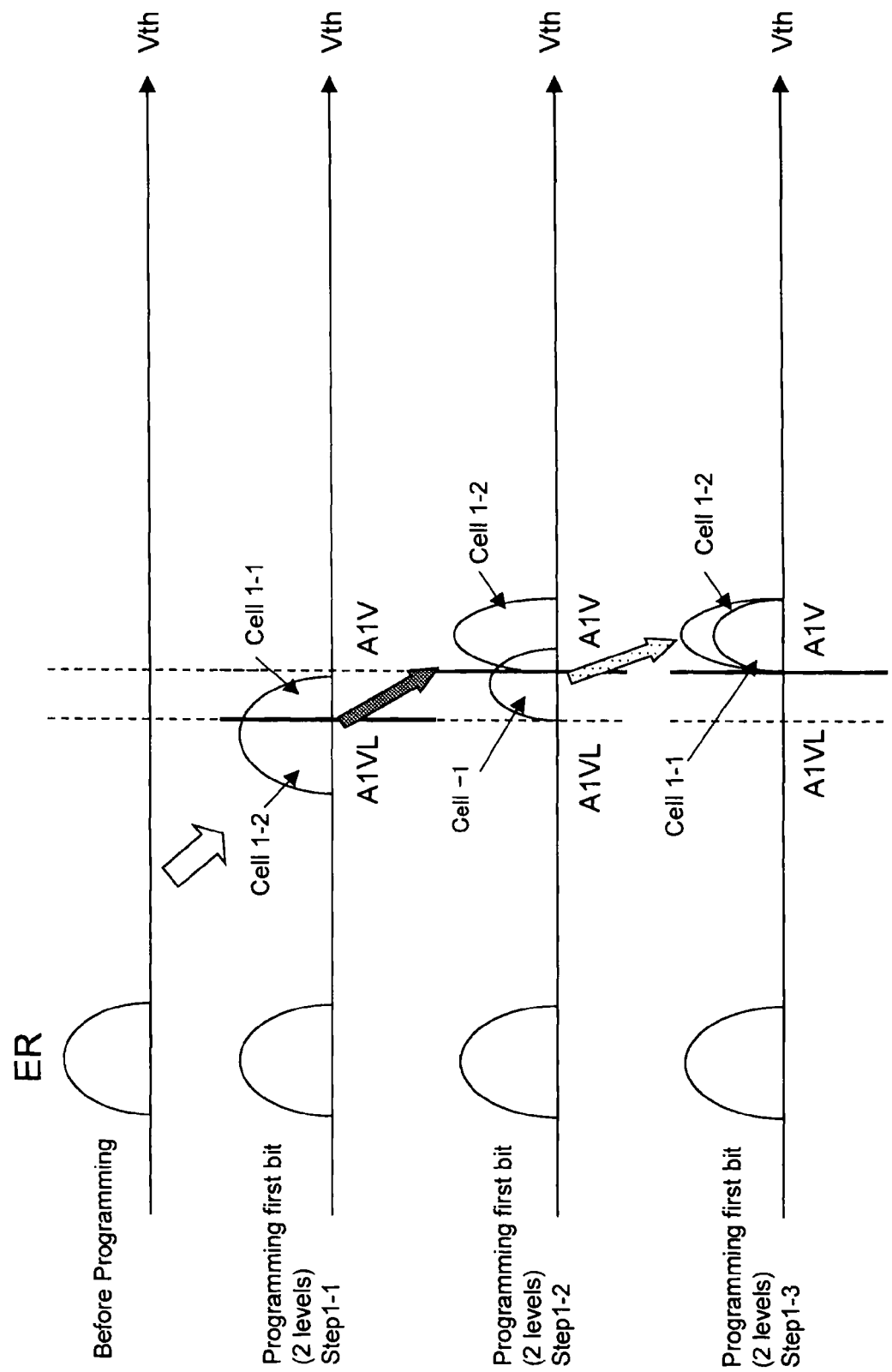

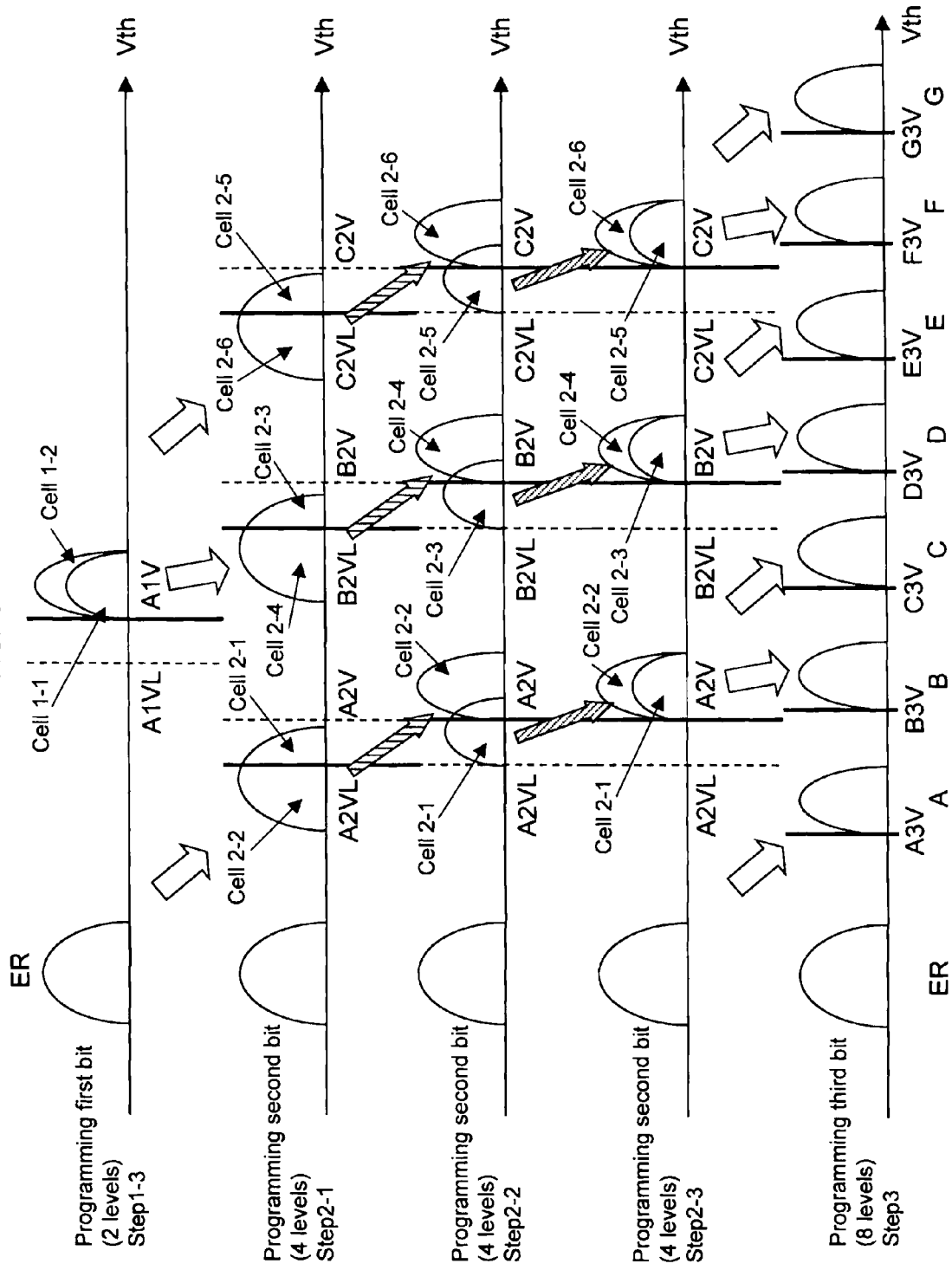

NONVOLATILE SEMICONDUCTOR MEMORY DEVICE AND CONTROL METHOD

CROSS REFERENCE TO RELATED APPLICATION

This application is based upon and claims the benefit of priority from the prior Japanese Patent Application No. 2008-72929, filed on Mar. 21, 2008, the entire contents of which are incorporated herein by reference.

BACKGROUND OF THE INVENTION

1. Field of the Invention

The present invention is related to a nonvolatile semiconductor memory device and in particular is related to a nonvolatile semiconductor memory device which is arranged with a plurality of nonvolatile memory cells and a method of controlling the device.

2. Description of the Related Art

In a nonvolatile semiconductor memory device such as a NAND type flash memory, the interval between adjacent memory cells is becoming narrow due to the progress of miniature processing. Together with a narrowing of the memory cell interval, capacitance between floating gates of adjacent memory cells is becoming larger and the threshold voltage of a memory cell which is programmed first fluctuates depending on the data of an adjacent memory cell which is subsequently programmed.

In addition, together with the progress of miniaturization, the variation in programming characteristics for each cell is increasing. For example, in a memory cell in which the speed at which it reaches a desired data programming state is fast, the possibility of the occurrence of program defect states such as over program (over program state of a selected cell) and program disturb (a state in which a non-selected cell is programmed and the threshold voltage distribution is shifted to a higher region) increases.

In addition, in a nonvolatile semiconductor memory device which includes a memory cell which stores multi-level data of a plurality of bits in one memory cell, many threshold voltage distributions are set and multi-level data is stored compared to a memory cell which stores 2 level data. As a result, it is necessary to very narrowly control the width of one threshold voltage distribution.

A programming method for narrowly controlling the width of a threshold voltage distribution of data to be programmed to a memory cell is disclosed, for example, in a nonvolatile semiconductor memory device cited in Japan Laid Open Patent 2003-196988 and in Japan Laid Open Patent 2004-192789. In the nonvolatile semiconductor memory device cited in Japan Laid Open Patent 2003-196988, the value of a programming control voltage which is supplied to a memory cell is changed according to the programming state of a memory cell and a widening of the threshold voltage distribution is reduced. In addition, in the nonvolatile semiconductor memory device cited in Japan Laid Open Patent 2004-192789, one page of data is programmed to a memory cell while considering the influence of capacitance between floating gates of adjacent memory cells and widening of the threshold voltage distribution is reduced when programming multi-level data.

BRIEF SUMMARY OF THE INVENTION

The nonvolatile semiconductor memory device related to embodiments of the present invention is arranged with a plurality of electrically reprogrammable memory cells, a read/program circuit, the read/program circuit programming desired data to the plurality of memory cells by supplying a program voltage and a program verification voltage, supplying a first program verification voltage to said plurality of memory cells when programming said data, and supplying a second program verification voltage which has a different voltage level to the first program verification voltage to the plurality of memory cells, and a read/program control circuit which determines memory cells which reach a first data program state and memory cells which do not reach the first data program state when the first program verification voltage is supplied, and which determines memory cells which reach a second data program state and memory cells which do not reach the second data program state when the second program verification voltage is supplied, and changes the programming operation state of each memory cell of the plurality of memory cells based on a result of each determination.

The method of controlling a nonvolatile semiconductor memory device related to embodiments of the present invention is included with a plurality of electrically reprogrammable memory cells, the method comprising, programming desired data by supplying a program voltage and a program verification voltage to the plurality of memory cells, supplying a first program verification voltage to said plurality of memory cells when programming said data, supplying to the plurality of memory cells a second program verification voltage which has a different level to the first program verification voltage, determining memory cells which reach a first data program state and memory cells which do not reach the first data program state when supplying the first program verification voltage, determining memory cells which reach a second data program state and memory cells which do not reach the second data program state when supplying the second program verification voltage; and supplying a program control voltage which changes a programming operation state of each memory cell based on a result of each of the determinations.

BRIEF DESCRIPTION OF THE DRAWINGS

FIG. 14 is a diagram which exemplary shows an example of a threshold voltage distribution of 2 level data which is programmed to a memory cell related to the third embodiment.

FIG. 15 is a diagram which exemplary shows an example of a threshold voltage distribution of 4 level data and 8 level data which is programmed to a memory cell related to the third embodiment.

DETAILED DESCRIPTION OF THE INVENTION

The embodiments of the present invention will be explained below while referring to the diagrams. The non-volatile semiconductor memory device related to the embodiments is explained here using a NAND type flash memory as an example. Furthermore, the same structural elements are labeled with the same symbols in the embodiments and therefore overlapping explanations will be omitted.

First Embodiment

Figure 1:
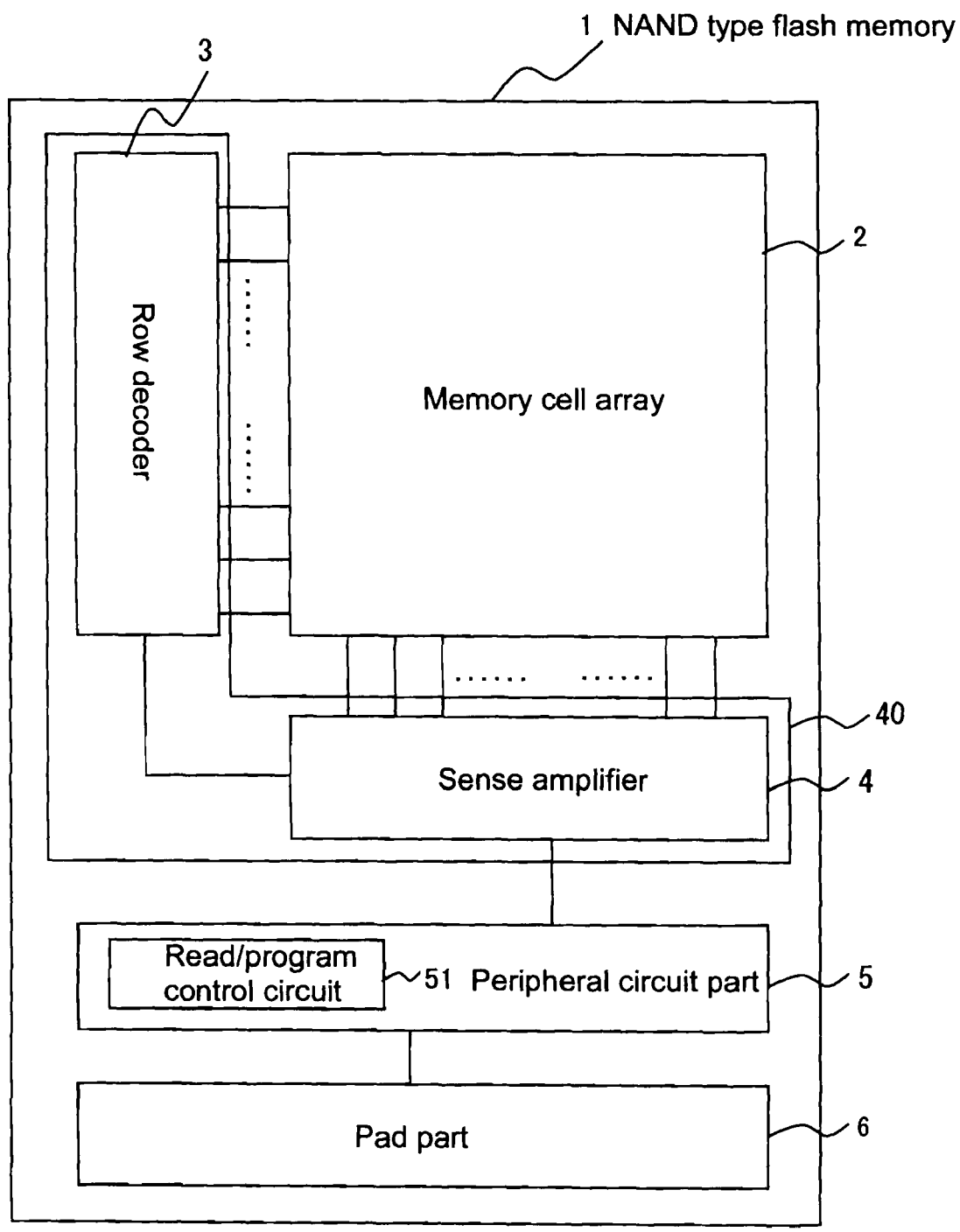
FIG. 1 is a diagram which shows an outline structure of the interior of a NAND type flash memory related to a first embodiment.

FIG. 1 is a diagram which shows an outline structure of a NAND type flash memory 1 related to the first embodiment of the present invention. As is shown in FIG. 1, the NAND type flash memory 1 related to the first embodiment of the present invention is arranged with a memory cell array 2, a row decoder 3, a sense amplifier 4, a read/program circuit part 40, a peripheral circuit part 5 and a pad part 6.

Figure 2:
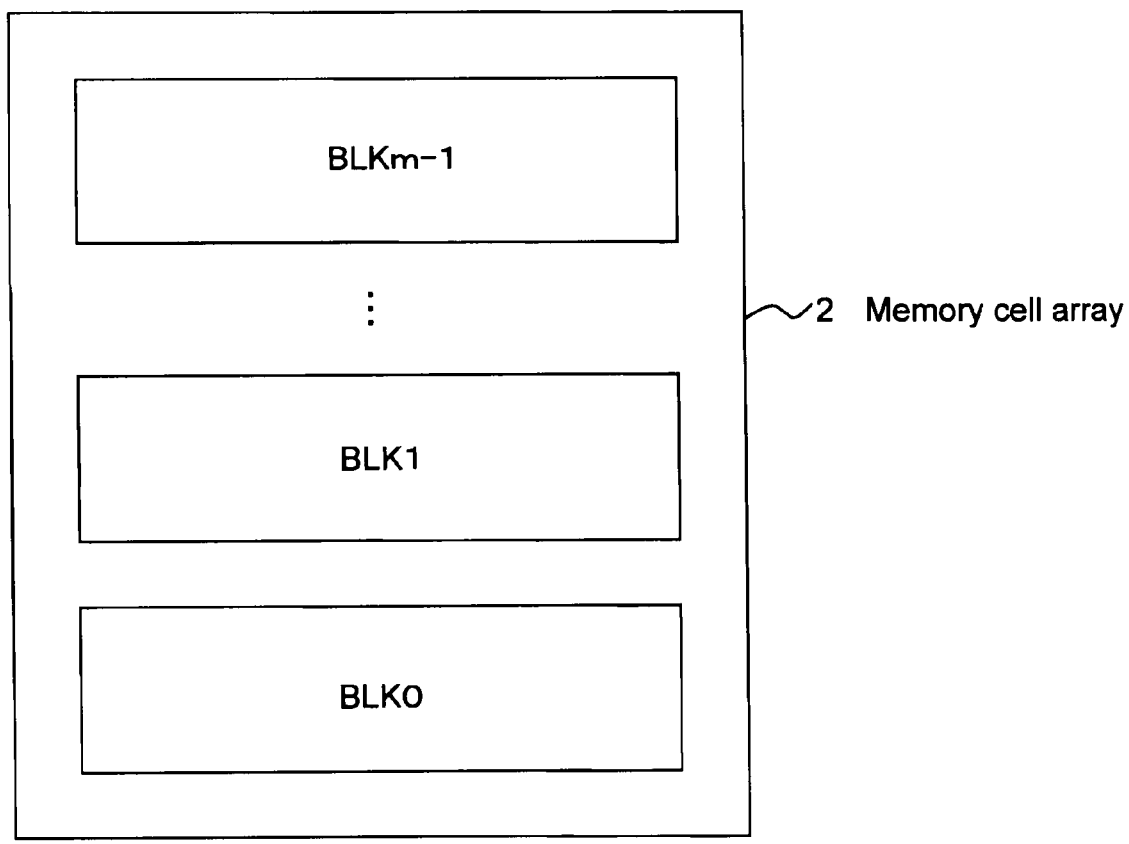
FIG. 2 is an outline block diagram which shows the structure of a memory cell array related to the first embodiment.

The memory cell array 2 related to the first embodiment includes a plurality of electrically reprogrammable memory cells arranged in a matrix. FIG. 2 is an outline block diagram which shows the structure of the memory cell array 2 related to the first embodiment. The memory cell array 2 includes a plurality (m) of memory cell blocks BLK0, BLK1, ..., BLKm−1, as is shown in FIG. 2. Here, a memory cell block is the smallest unit in which data can be erased.

Figure 3:
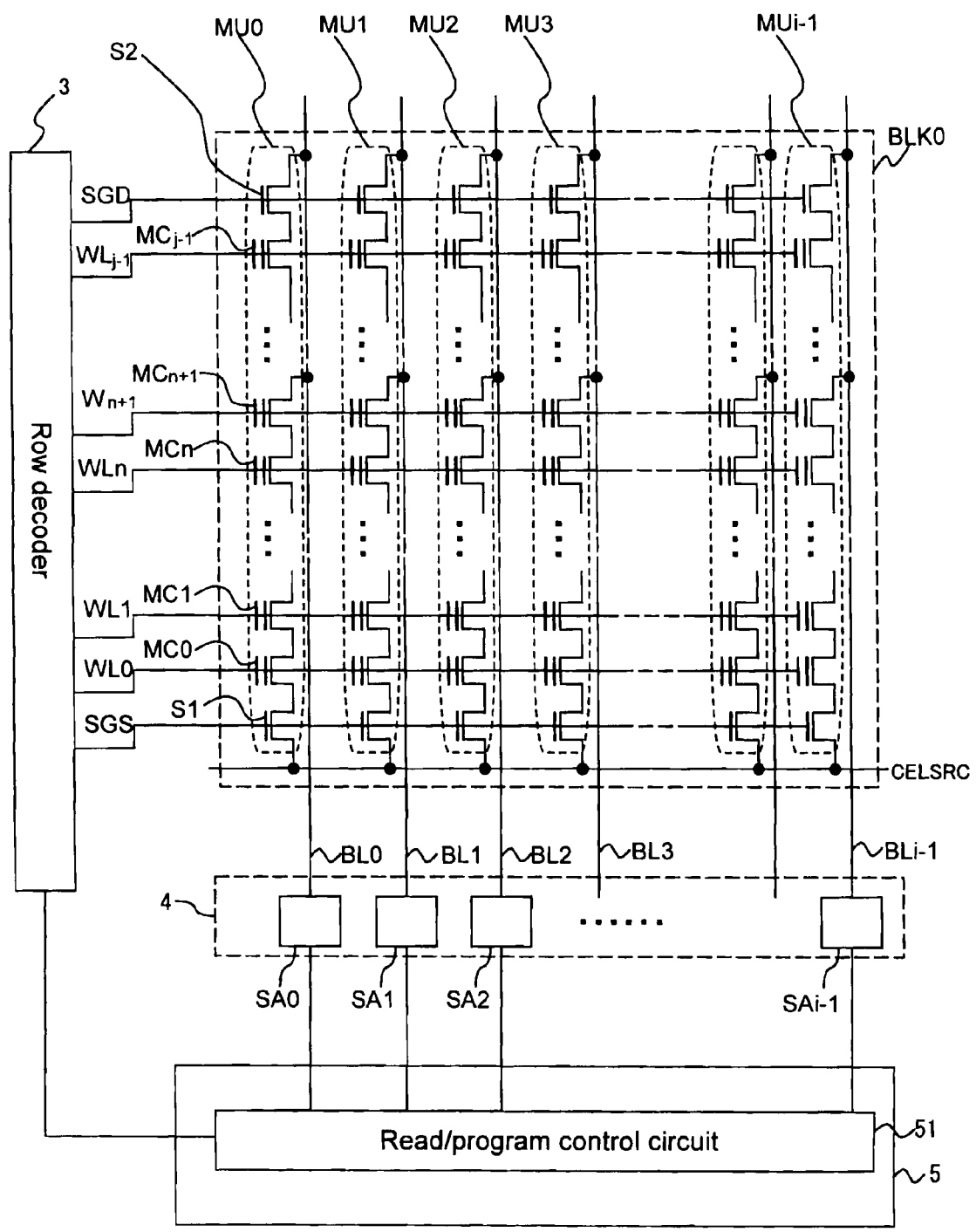
FIG. 3 is a diagram which shows a detailed example structure of a memory cell block related to the first embodiment.

Next, FIG. 3 is a block diagram which shows a more detailed structural example of one memory cell block (for example, BLK0) among the plurality of memory cell blocks BLK0, BLK1, ..., BLKm−1 related to the first embodiment. As is shown in FIG. 3, each of the memory cell blocks BLK0, BLK1, ..., BLKm−1 includes a plurality (i) of memory cell units MU0, MU1, ..., MUi−1. Each of the memory cell units MU0, MU1, ..., MUi−1 includes a plurality (j) of memory cells MC0, MC1, ..., MCj−1, a source side selection transistor S1 and a drain side selection transistor S2. The plurality (j) of memory cells MC0, MC1, ..., MCn, MCn+1, ..., MCj−1, are arranged in series in a shape in which a source and drain region are shared. The source side selection transistor S1 is connected to one end (source region side) of a serial connection body of the memory cells MC0, MC1, ..., MCn, MCn+1, ..., MCj−1. The drain side selection transistor S2 is connected to another end (drain region side) of the serial connection body of the memory cells MC0, MC1, ..., MCn, MCn+1, ..., MCj−1.

In addition, the memory cell blocks BLK1, ..., BLKm−1, are arranged with a plurality (2) of gate lines SGS, SGS, a plurality (j lines) of word lines WL0. WL1, ..., WLj−1, and a plurality (i lines) of bit lines BL0, BL1, ..., BLi−1.

The plurality (j lines) of word lines WL0, WL1, ..., WLn, WLn+1, ..., WLj−1 are arranged along the gate lines SGS, SGD. The plurality (i lines) of bit lines BL0, BL1, ..., BLi−1 are arranged so that they intersect the plurality of gate lines SGS, SGD and the word lines WL0, WL1, ..., WLn, WLn+1, ..., WLj−1.

The gate line SGS is commonly connected to a gate of the source side selection transistor S1 of each memory cell unit MU0, MU1, ..., MUi−1 in the memory cell blocks BL0, BL1, ..., BLKm−1. The gate lines SGD is commonly connected to a gate of the drain side selection transistor S2 of each memory cell unit MU0, MU1, ..., MUi−1 in the memory cell blocks BL0, BL1, ..., BLKm−1.

In addition, each of the plurality of bit lines BL0, BL1, ..., BLi−1 is connected to the drain region of the drain side selection transistor S2 of a corresponding memory cell unit MU0, MU1, ..., MUi−1. The source region of the source side selection transistor S1 is connected to a common source line CELSRC of each memory cell block BLK0, BLK1, ..., BLKm−1.

Furthermore, each of the memory cells MC0, MC1, ..., MCj−1 in each of the memory cell blocks BLK0, BLK1, ..., BLKm−1 is commonly connected via a memory cell and word line which are electrically in a similar connection position in another memory cell unit.

Furthermore, the word lines WL0, WL1, ..., WLj−1 and the gate lines SGS, SGD in each of the memory cell blocks BLK0, BLK1, ..., BLKm−1 in the first embodiment are connected to an external row decoder 3 of the memory cell array 2. In addition, the plurality of bit lines BL0, BL1, ..., BLi−1 are connected to any one of a plurality (i) of sense amplifier circuits SA0, SA1, ..., SAi−1 (see FIG. 3) in an external sense amplifier 4 of the memory cell array 2.

The sense amplifier 4 is arranged with a plurality of sense amplifier circuits SA0, SA1, ..., SAi−1 as shown in FIG. 3. The peripheral circuit part 5 is arranged with a read/program control circuit 51. The read/program control circuit 51 is connected to the plurality (i) of sense amplifier circuits SA0, SA1, ..., SAi−1 and the row decoder 3. The read/program control circuit 51 determines from a program verification result the voltage which a read/program circuit part 40 supplies to a memory cell MC and is also a circuit which instructs the read/program circuit part 40 to supply this voltage.

The read/program circuit part 40 is a circuit which supplies a voltage such as a program voltage, a program verification voltage and a program control voltage to memory cells MC according to an instruction from the read/program control circuit 51. Furthermore, a program voltage is a voltage which is supplied to a word line WL via the row decoder 3 when charges are injected into a floating gate of a memory cell MC. A program verification voltage is a voltage which is supplied to a word line WL via the row decoder 3 when confirming whether the threshold voltage of memory cells MC have reached a desired level. A program control voltage is a voltage which is supplied to a bit line BL via a sense amplifier SA for setting whether to allow or inhibit programming to memory cells which is to be applied with a program voltage from a word line WL. In the case where this program control voltage is applied to memory cells MC as a program inhibit voltage, even if these memory cells MC are applied with a program voltage, programming does not occur.

Figure 4:
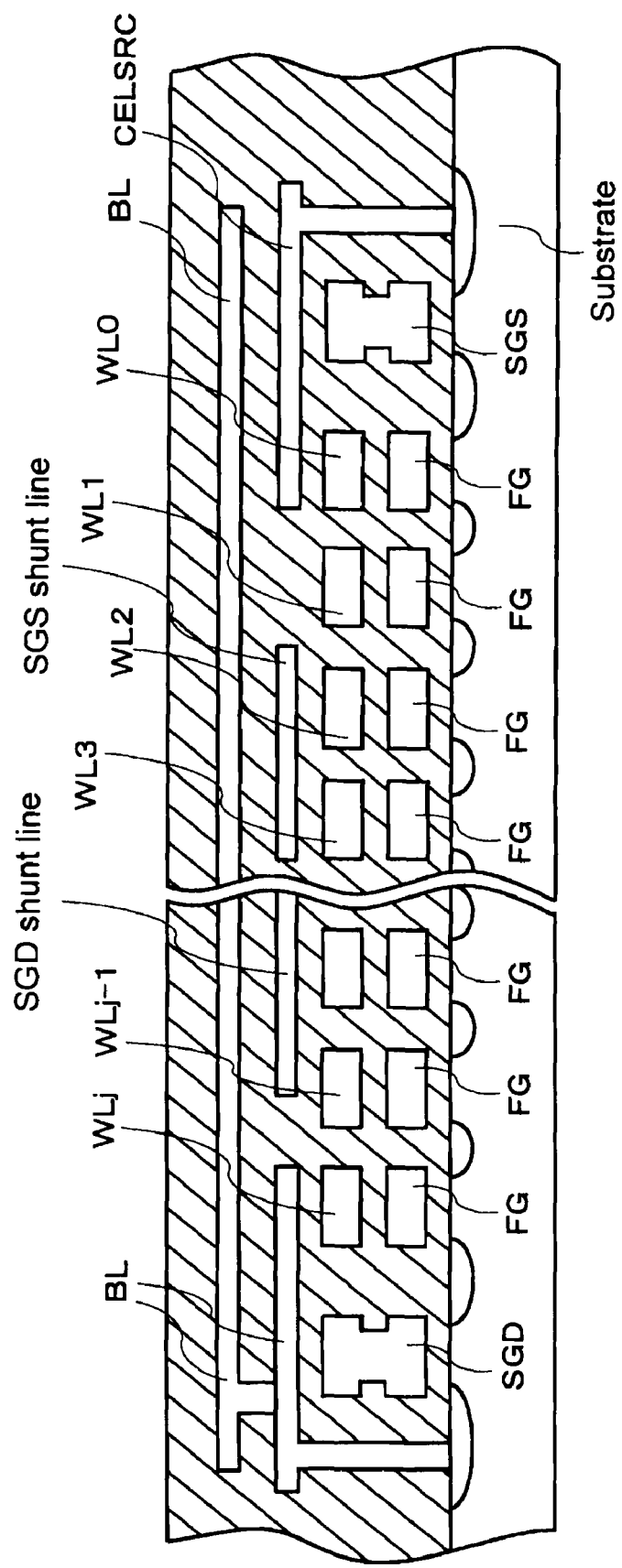
FIG. 4 is a diagram which shows a cross section along a bit line of one memory cell unit of a NAND type flash memory related to the first embodiment.

Here, a partial cross-sectional view of the NAND type flash memory 1 related to the first embodiment is shown in FIG. 4. FIG. 4 is a diagram of a cross section along a bit line of one memory cell unit of the NAND type flash memory 1 related to the first embodiment. As is shown in FIG. 4, this NAND type flash memory 1 includes a substrate, a plurality of floating gates FG and selection gate lines SGS, SGD formed via an interlayer insulation layer above the substrate, and word lines WL0, WL1, . . . , WLn, WLn+1, . . . , WLj−1, WLj arranged via an interlayer insulation layer above the floating gates FG.

In addition, a diffusion layer which functions as a source/drain layer of memory cells is formed in the substrate and are common between adjacent floating gates FG. Using these structures the NAND type flash memory 1 a voltage is applied between a word line and a channel, the amount of charge which is accumulates in the floating gates is controlled and by changing the threshold voltage distribution in the floating gate FG it is possible to store data.

Figure 5:
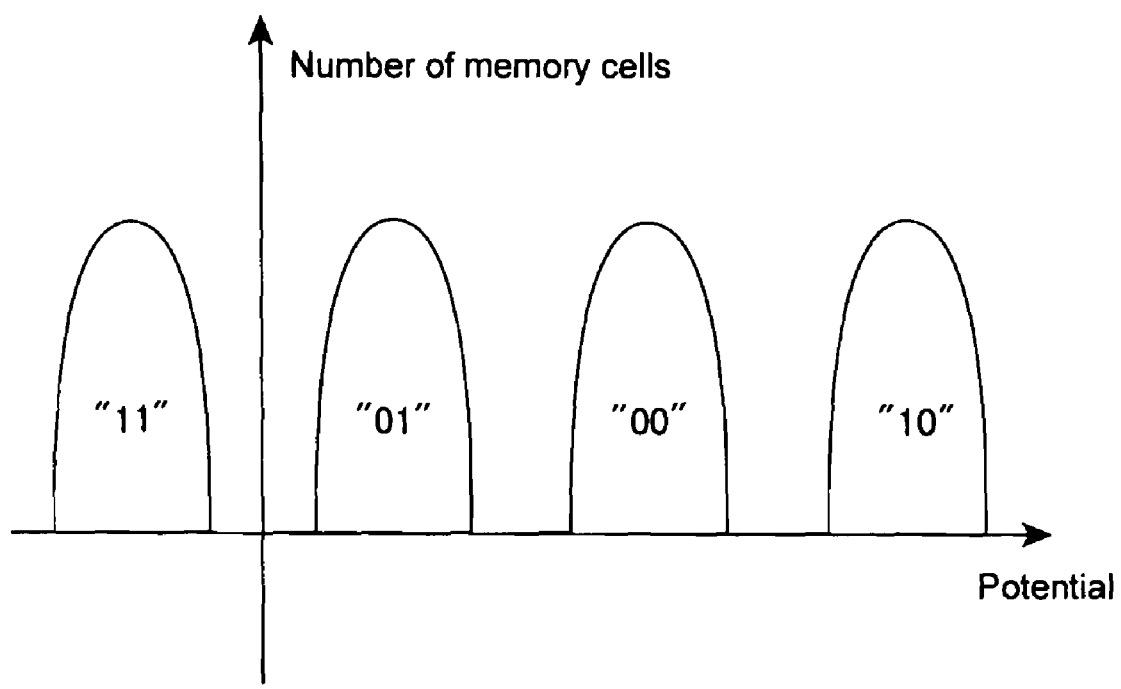
FIG. 5 is a diagram which shows a threshold voltage distribution of a floating gate in one memory cell of a NAND type flash memory related to the first embodiment.

The NAND type flash memory 1 performs a data programming operation using the above stated structure and an outline of this programming operation is explained using FIG. 5.

FIG. 5 is a diagram which shows threshold voltage distributions of a floating gate in one memory cell unit of the NAND type flash memory 1 related to the first embodiment. In the NAND type flash memory 1 as stated above, a voltage is applied between a word line and a channel and by changing the threshold voltage distribution by an injection of charges into the floating gate of a memory cell, it is possible to program data.

That is, for example, as is shown in FIG. 5, the threshold voltage distribution of a floating gate FG has four states (from the left side of the diagram "11", "01", "00", "10") and by selecting any one of these states of the threshold voltage distributions of these floating gates it is possible to store 2 bit (four levels) data.

Next, performing a programming operation of 2 level data in the NAND type flash memory 1 of the first embodiment will be explained while referring to the flowchart is FIG. 6. In a programming control related to the first embodiment which is applied to this 2 level data programming operation, a plurality of program verification voltages are required for one threshold voltage distribution. In the programming control explained below, an example is explained in which two program verification voltages AVL, AV are set where x=A for one threshold voltage distribution. The relationship between these program verification voltages is AVL<AV.

In addition, in the programming control of 2 level data related to the first embodiment, the program verification voltage AVL is called a first program verification voltage AVL and the program verification voltage AV is called a second program verification voltage AV. The first program verification voltage AVL is a voltage for classifying a memory cell in which programming speed is fast and a memory cell in which programming speed is slow among the plurality of memory cells with the memory cell array 2. The second program verification voltage AV is a voltage for determining the bottom of x=A in the threshold voltage distribution. The first program verification voltage AVL and the second program verification voltage AV are set by the read/program control circuit 51. The read/program control circuit 51 controls the row decoder 3 and supplies at appropriate times the first program verification voltage AVL and the second program verification voltage AV to a word line WL when the programming operation of 2 level data shown below is performed.

Figure 6:
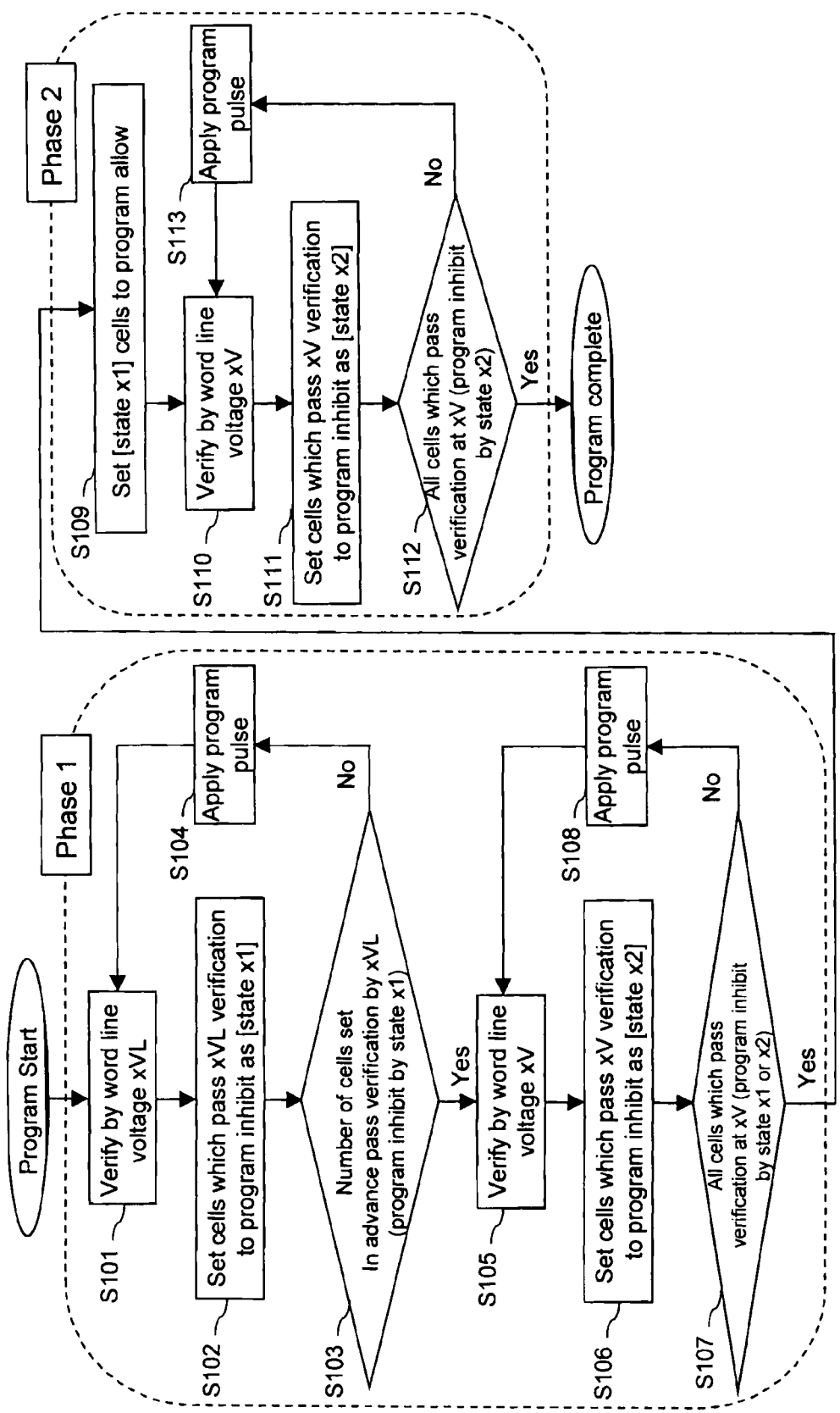
FIG. 6 is a flowchart which shows a programming operation which is performed in a NAND type flash memory related to the first embodiment.

Furthermore, the [word line voltage xVL] and [word line voltage xV] shown in FIG. 6 show a program verification voltage which is supplied to a word line WL. In the case where 2 level data is programmed, because the threshold voltage distribution is x=A, [word line voltage xVL] becomes [first program verification voltage AVL] and [word line voltage xV] becomes [second program verification voltage AV]. In addition, [state x1] and [state x2] shown in FIG. 6 show the state of a threshold voltage distribution of memory cells MC. In the case where 2 level data is programmed, because the threshold voltage distribution is x=A, [state x1] becomes [state A1] and [state x2] becomes [state A2].

In FIG. 6, when a programming operation begins, that is, when a program control voltage for allowing programming is supplied from the read/program circuit 40 to a bit line BL which is connected to a memory cell unit MU to be programmed, and when a program voltage Vpgm is supplied from the read/program circuit part 40 to a word line WL connected to memory cells MC within the memory cell unit MU, the threshold voltage Vth increase in order beginning with the memory cells in which programming speed is fast. Next, the first program verification voltage AVL is supplied to a word line WL which is connected to memory cells MC within a memory cell unit MU from the row decoder 3 and a program verification operation is performed based on the first program verification voltage AVL (step S101). The read/program control circuit 51 stores memory cells MC in which the threshold voltage Vth has passed the first program verification voltage AVL as in [state A1] [first state], and also sets these memory cells MC to program inhibit (step S102). That is, the memory cells MC in which the threshold voltage Vth has reached the first program verification voltage AVL are changed to a program inhibit state by changing the program control voltage which is applied to a bit line BL of these memory cells MC so that charges are not injected by the program voltage Vpgm.

Next, the read/program control circuit 51 confirms whether the threshold voltage Vth of the number of memory cells set in advance has passed (program inhibit at (state A1)) the first program verification voltage AVL (step S103). In the case where the threshold voltage Vth of the number of memory cells set in advance has not passed the first program verification voltage AVL (step S103: NO), the process shifts to step S104 and supply of the program voltage Vpgm is continued. In addition, in the case where the threshold voltage Vth of the number of memory cells set in advance has passed the first program verification voltage AVL (step S103: YES), the process shifts to step S105.

In step S105, the read/program control circuit 51 switches the program verification voltage setting from the first program verification voltage AVL to the second program verification voltage AV. As a result, the second verification voltage AV is supplied from the row decoder 3 to a word line WL which is connected to memory cells MC within a memory cell unit MU and a program verification operation is carried out based on the second verification voltage AV. In the process in step S105, a program verification operation is carried out with the second program verification voltage AV to memory cells MC in which are not set with program inhibit in step S102, that is, to memory cells MC in which the threshold voltage Vth has not reached the first program verification voltage AVL. These memory cells MC are written as memory cells in which programming speed is slow in the first embodiment.

Next, the read/program control circuit 51 stores memory cells MC in which the threshold voltage Vth has passed the second program verification voltage AV as [state A2] (second state), and also sets these memory cells MC to program inhibit (step S106). That is, the program control voltage applied to a bit line BL of these memory cells MC is changed and the memory cells MC are set to a program inhibit state so that the memory cells MC in which the threshold voltage Vth has reached the second program verification voltage AV are not injected with charges by the program voltage Vpgm.

Next, the read/program control circuit 51 confirms whether the threshold voltage Vth of all the memory cells MC has passed the first program verification voltage AVL or the second program verification voltage AV (program inhibit at [state A1] or [state A2]) (step S107). In the case where the threshold voltage Vth of all the memory cells has not passed the first program verification voltage AVL or the second program verification voltage AV (step S107: NO), the process shifts to step S108 and the supply of the program voltage Vpgm continues. In addition, in the case where the threshold voltage Vth of all the memory cells has passed the first program verification voltage AVL or the second program verification voltage AV (step S107: YES), the process shifts to step S109.

In embodiment one, the programming process in steps S101 to S109 shown above is called 'phase one'.

Next, in step S109, the read/program control circuit 51 resets the memory cells set to program inhibit in a [state A1] in step S102, to program allow. At this time, a voltage which is applied to a word line WL of these memory cells MC is supplied so that charges are injected by the program voltage Vpgm into memory cells MC which is set at program allow.

Next, the second program verification voltage AV is supplied to a word line WL which is connected to memory cells which is set to program allow from the row decoder 3 and a program verification operation is performed based on the second program verification voltage AV (step S110). Next, the read/program control circuit 51 stores the memory cells MC in which the threshold voltage Vth has passed the second program verification voltage AV as [state A2] and sets these memory cells to program inhibit (step S111). That is, the program control voltage applied to a bit line BL of these memory cells MC is changed and the memory cells MC are set to a program inhibit state so that the memory cells MC in which the threshold voltage Vth has reached the second program verification voltage AV are not injected with charges by the program voltage Vpgm.

Next, the read/program control circuit 51 confirms whether the threshold voltage Vth of all the memory cells MC has passed the second program verification voltage AV (program inhibit at [state A2]) (step S112). In the case where the threshold voltage Vth of all the memory cells has not passed the second program verification voltage AV (step S112: NO), the process shifts to step S113 and the supply of the program voltage Vpgm continues. In addition, in the case where the threshold voltage Vth of all the memory cells has passed the second program verification voltage AV (step S112: YES), the programming operation is complete.

In the first embodiment, the programming process in steps S109 to S113 shown above is called 'phase two'.

Figure 7:
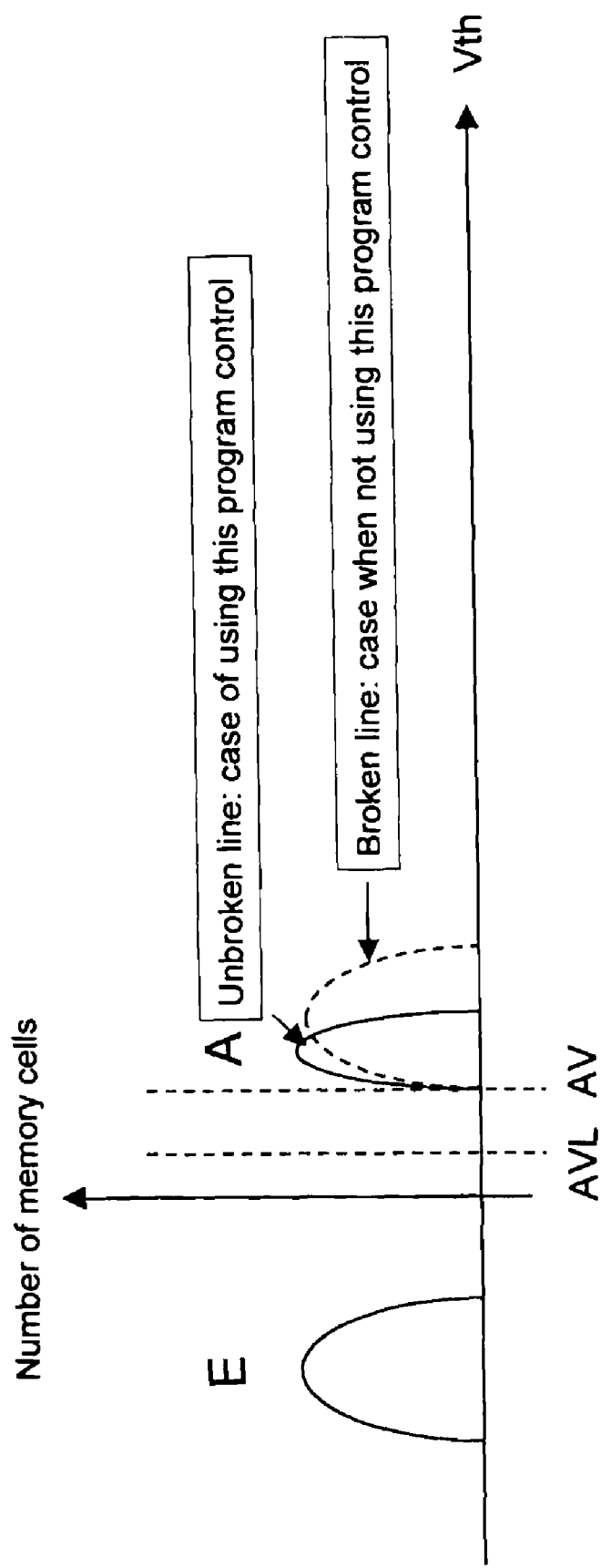
FIG. 7 is a diagram which exemplary shows an example of a threshold voltage distribution of 2 level data which is programmed to a memory cell related to the first embodiment.

An example of the threshold voltage distribution after memory cells MC have been programmed with 2 level data as a result of the above stated programming operation is shown in FIG. 7. FIG. 7 is a diagram which shows an example of the threshold voltage distribution of 2 level data which has been programmed to memory cells. As is shown in FIG. 7, it is possible to make the threshold voltage distribution of memory cells which are not applied with the programming control shown in FIG. 6 narrower than the threshold voltage distribution of memory cells which are applied with the programming control.

As stated above, in the NAND type flash memory 1 related to the first embodiment, a first and second program verification voltage AVL and AV (AVL<AV) is set to one threshold voltage distribution: x=A in the program control which programs 2 level data. Then, memory cells MC in which programming speed is fast and memory cells MC in which programming speed is slow are categorized using the first program verification voltage AVL and a program operation of memory cells in which programming speed is fast is inhibited once. In addition, a program verification process of memory cells MC in which programming speed is slow is continued using the second verification voltage AV, the memory cells in which a programming operation is inhibited once are reset as program allow and the program verification operation of all the memory cells is complete.

Therefore, it is possible to program the memory cells MC in which programming speed is fast and in which a programming operation is inhibited once by using capacitive coupling between floating gates. As a result it is possible to reduce over programming of memory cells MC in which programming speed is fast and narrow the width of a threshold voltage distribution. That is, by shifting the threshold voltage Vth using capacitance coupling which occurs between floating gates it is possible to gradually perform a data program operation even to memory cells MC in which programming speed is fast. In addition, in the memory cells MC set with program inhibit using the first program verification voltage AVL it is possible to reduce widening of the threshold voltage distribution by capacitance coupling between floating gates FG according to the difference between the first program verification voltage AVL and the second program verification voltage AV. Furthermore, in the program control related to embodiment one, by categorizing memory cells according to each programming speed, it is possible to set a programming voltage which matches the programming speed of each memory cell MC and improve reliability of a programming operation.

Second Embodiment

In the second embodiment, the case where the NAND type flash memory 1 is programmed with 4 level data will be explained by applying the flowchart of program operations shown in FIG. 6. Furthermore, because the structure of the NAND type flash memory 1 related to the second embodiment is the same as that shown in FIG. 1 to FIG. 4 stated above, a structural explanation will be omitted here.

A programming operation of 4 level data which is performed to the NAND type flash memory cell 1 related to the second embodiment will be explained while referring to the flowchart shown in FIG. 6 and the transition diagram of a threshold voltage distribution shown in FIG. 8 to FIG. 10. In the flowchart shown in FIG. 6, six types of program verification voltage AVL, AV, BVL, BV, CVL and CV used in program verification control are set as parameters related to program control of the second embodiment to everything shown by the threshold voltage distribution: x=A, B, C (see FIG. 11). The relationship between these voltages is AVL<AV<BVL<BV<CVL<CV. In addition, in the flowchart shown in FIG. 6, six state types A1, A2, B1, B2, C1, C2 are set as states (in the case of a structure in which data is stored by arranging a storage circuit (buffer etc) for each memory cell) of the threshold voltage distribution of memory cells MC.

In addition, in the program control of 4 level data related to the second embodiment, the program verification voltages AVL, BVL and CVL are given as first program verification voltages AVL, BVL and CVL, and the program verification voltages AV, BV and CV are given as second program verification voltages AV, BV and CV. The first program verification voltages AVL, BVL and CVL are voltages for categorizing memory cells into memory cells in which programming speed in fast and memory cells in which programming speed is slow among the plurality of memory cells within the memory cell array 2. The second program verification voltages AV, BV and CV are voltages for determining the potential at the bottom of the threshold voltage distribution: x=A, B, C. These first program verification voltages AVL, BVL and CVL and second program verification voltages AV, BV and CV are set by the read/program control circuit 51. The read/program control circuit 51 controls the row decoder 3 and supplies the first program verification voltages AVL, BVL and CVL and the second program verification voltages AV, BV and CV to a word line WL at appropriate times when a program operation of 4 level data shown below is performed.

Furthermore, [word line voltage xVL] and [word line voltage xV] shown in FIG. 6 indicate a program verification voltage supplied to a word line WL. In the case where 4 level data is to be programmed, because the threshold voltage distribution is x=A, B, C, [word line voltage xVL becomes [first program verification voltage AVL, BVL, CVL] and [word line voltage xV] becomes [second program verification voltage AV, BV, CV]. In addition, [state x1] and [state x2] shown in FIG. 6, indicate the state of the threshold voltage distribution of memory cells MC. In the case where 4 level data is to be programmed, because the threshold voltage distribution is x=A, B, C, [state x1] becomes [state A1, B1, C1] and [state x2] becomes [state A2, B2, C2].

When a program operation beings in FIG. 6, that is, when a program control voltage which allows programming is supplied from the read/program circuit 40 to a bit line BL which is connected to a memory cell unit MU which is to be programmed and the program voltage Vpgm is supplied to a world line WL connected to memory cells MC, the threshold voltage rises gradually from the memory cells in which programming speed is fast. Next, the first program verification voltage AVL is supplied from the row decoder 3 to the word line WL which is connected to memory cells MC within a memory cell unit MU, and a program verification operation is performed based on the first program verification voltage AVL (step S101). The read/program control circuit 51 stores the memory cells MC in which the threshold voltage Vth passes the first program verification voltage AVL as [state A1] and sets a program inhibit to these memory cells MC (step S102). That is, the program control voltage which is applied to the bit line BL of the memory cells MC is changed and set to a program inhibit state so that these memory cells MC in which the threshold voltage Vth reaches the first program verification voltage AVL are not injected with charges by the program voltage Vpgm.

Next, the read/program control circuit 51 confirms whether the threshold voltage Vth of the number of memory cells set in advance has passed (program inhibit at (state A1)) the first program verification voltage AVL (step S103). In the case where the threshold voltage Vth of the number of memory cells set in advance has not passed the first program verification voltage AVL (step S103: NO), the process shifts to step S104 and supply of the program voltage Vpgm is continued. In addition, In the case where the threshold voltage Vth of the number of memory cells set in advance has passed the first program verification voltage AVL (step S103: YES), the process shifts to step S105.

Figure 8:
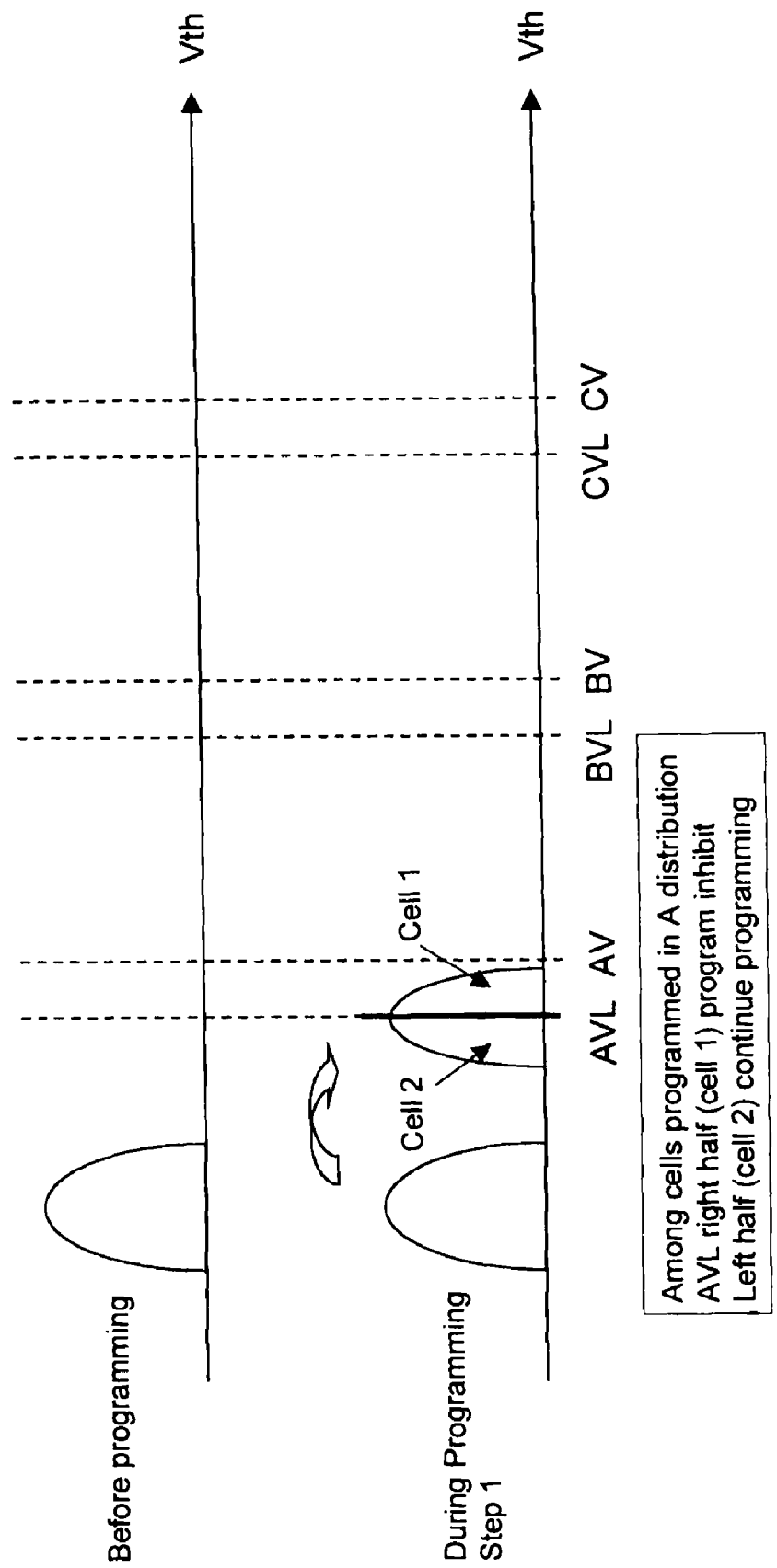
FIG. 8 is a diagram which exemplary shows an example of a threshold voltage distribution of 4 level data which is programmed to a memory cell related to a second embodiment.

An example of a threshold voltage distribution when data equivalent to the threshold voltage A is programmed to memory cells MC by the programming processes in step S101 to S103 is shown in FIG. 8. FIG. 8 is a diagram which exemplary shows a distribution state of the threshold voltage Vth when data equivalent to the threshold voltage A is programmed to a plurality of memory cells MC (cell 1, 2). As shown in [during programming step 1] in FIG. 8, among the memory cells 1, 2 which are programmed with data equivalent to the threshold voltage A, the cell 1 on the right half in which the threshold voltage Vth has reached the first program verification voltage AVL is set at program inhibit and the cell 2 on left half in which the threshold voltage Vth has not reached the first program verification voltage AVL continues to be programmed.

Next, in step S105, the read/program control circuit 51 switches the program verification voltage setting from the first program verification voltage AVL to the second program verification voltage AV. As a result, the second verification voltage AV is supplied from the row decoder 3 to a word line WL which is connected to memory cells MC within a memory cell unit MU and a program verification operation is carried out based on the second verification voltage AV. In the process in step S105, a program verification operation is carried out with the second program verification voltage AV to memory cells MC which are not set with program inhibit in step S102, that is, to memory cells MC in which the threshold voltage Vth has not reached the first program verification voltage AVL. These memory cells MC are written as memory cells in which programming speed is slow in the second embodiment.

Next, the read/program control circuit 51 stores memory cells MC in which the threshold voltage Vth has passed the second program verification voltage AV as [state A2], and also sets these memory cells MC to program inhibit (step S106). That is, the program control voltage applied to a bit line BL of these memory cells MC is changed and the memory cells MC are set to a program inhibit state so that the memory cells MC in which the threshold voltage Vth has reached the second program verification voltage AV are not injected with charges by the program voltage Vpgm.

Figure 9:
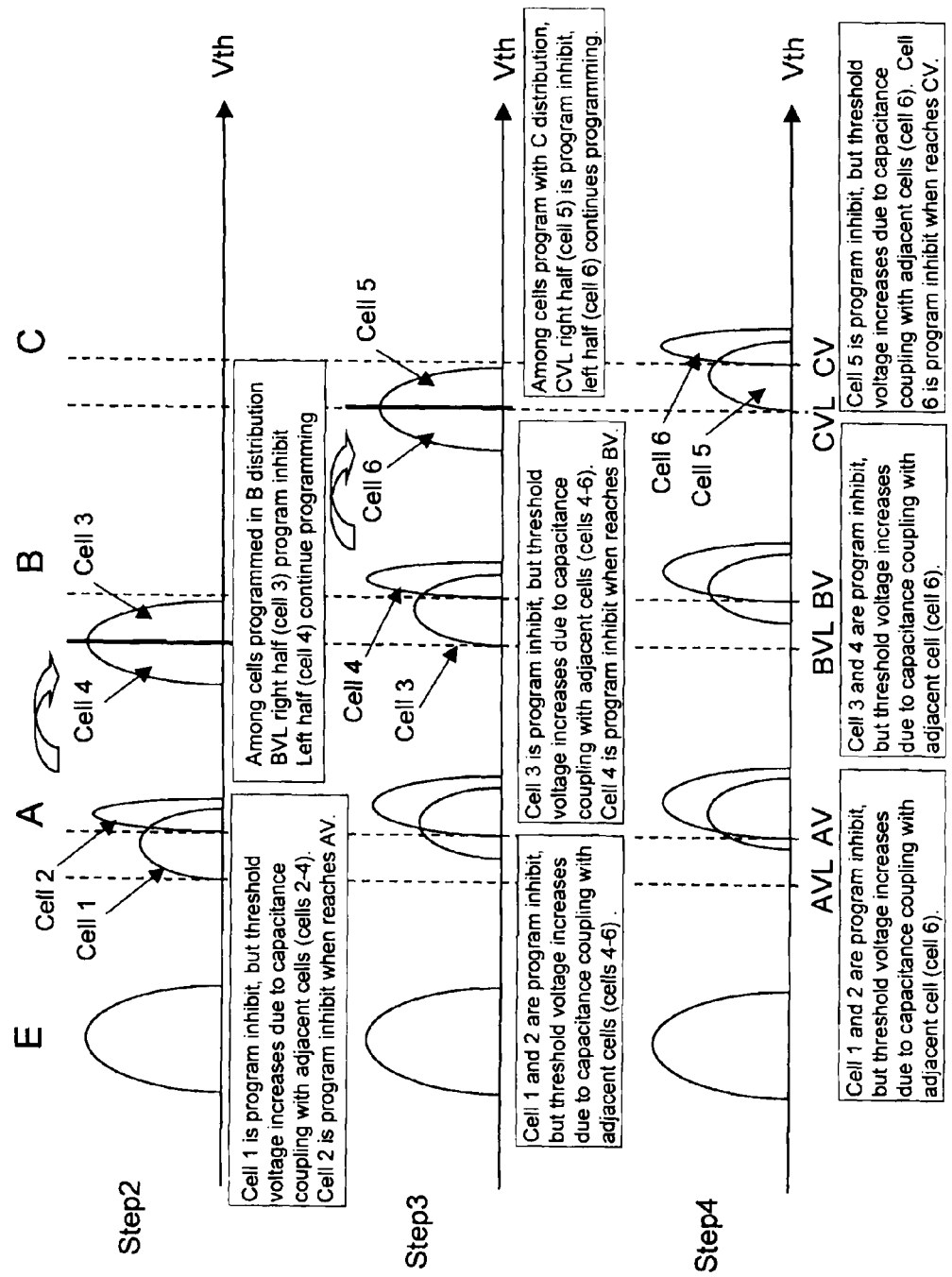
FIG. 9 is a diagram which exemplary shows an example of a threshold voltage distribution of 4 level data which is programmed to a memory cell related to the second embodiment.

An example of a threshold voltage distribution when data equivalent to the threshold voltage A is programmed to memory cells MC by the programming processes in step S105 to S106 is shown in [step 2] in FIG. 9. This [step 2] in FIG. 9 is a diagram which exemplary shows a distribution state of the threshold voltage Vth when data equivalent to the threshold voltage A is programmed to a plurality of memory cells MC (cell 1, 2). In FIG. 9, as shown in [step 2] the cell 1 in [step 1] of FIG. 8 is set at program inhibit, however, the threshold voltage Vth rises due to capacitance coupling with adjacent cells 2 to 4. In addition, because the threshold voltage Vth has reached the second program verification voltage AV, the cell 2 is set at program inhibit.

The processes in steps S101 to S106 stated above are similarly performed in the case where 4 level data equivalent to when the threshold voltage distribution is x=B, is programmed. In [step 2] in FIG. 9, the result of a programming process in which the first program verification voltage BVL and the second verification voltage BV are applied when the threshold voltage distribution is x=B is shown by cell 3, 4. As is shown in [step 2] in FIG. 9, among the cells 3, 4 which are programmed with data equivalent to the threshold voltage B, the cell 3 on the right half in which the threshold voltage Vth has reached the first program verification voltage BVL is set at program inhibit [state B1] and the cell 4 on the left half in which the threshold voltage Vth has not reached the first program verification voltage BVL continues to be programmed.

Next, in step S105, the read/program control circuit 51 switches the program verification voltage setting from the first program verification voltage BVL to the second program verification voltage BV. As a result, the second verification voltage BV is supplied from the row decoder 3 to a word line WL which is connected to memory cells MC within a memory cell unit MU and a program verification operation is carried out based on the second verification voltage BV. In the process in step S105, a program verification operation is carried out with the second program verification voltage BV to memory cells MC which are not set with program inhibit in step S102, that is, to memory cells MC in which the threshold voltage Vth has not reached the first program verification voltage BVL. Next, the read/program control circuit 51 stores memory cells MC in which the threshold voltage Vth has passed the second program verification voltage BV as [state B2] and these memory cells MC are set at program inhibit (step S106). That is, the program control voltage applied to a bit line BL of these memory cells MC is changed and the memory cells MC are set to a program inhibit state so that the memory cells MC in which the threshold voltage Vth has reached the second program verification voltage BV are not injected with charges by the program voltage Vpgm.

An example of a threshold voltage distribution when data equivalent to the threshold voltages A, B are programmed to memory cells by the programming processes in step S105 to step 106 is shown in [step 3] in FIG. 9. This [step 3] in FIG. 9 is a diagram which exemplary shows a distribution state of the threshold voltage Vth when data equivalent to the threshold voltages A, B are programmed to a plurality of memory cells MC (cell 1, 2, 3, 4). As is shown by [step 3] in FIG. 9, cell 1, 2, 3 were set as program inhibit in [step 2] in FIG. 9, however, the threshold voltage Vth rises by capacitance coupling with adjacent memory cells 4 to 6. In addition, because the threshold voltage Vth reaches the second program verification voltage BV, cell 4 is set at program inhibit.

The processes in steps S101 to S106 stated above are similarly performed also in the case where 4 level data which is equivalent to the threshold voltage distribution when x=c, is programmed. In [step 3] in FIG. 9, the result of a programming process in which the first program verification voltage CVL and the second verification voltage CV are applied when the threshold voltage distribution is x=c is shown by cell 5, 6. As is shown in [step 3] in FIG. 9, among the cells 5, 6 which are programmed with data equivalent to the threshold voltage C, the cell 5 on the right half in which the threshold voltage Vth has reached the first program verification voltage CVL is set at program inhibit [state C1] and the cell 6 on the left half in which the threshold voltage Vth has not reached the first program verification voltage CVL continues to be programmed.

Next, in step S105, the read/program control circuit 51 switches the program verification voltage setting from the first program verification voltage CVL to the second program verification voltage CV. As a result, the second verification voltage CV is supplied from the row decoder 3 to a word line WL which is connected to memory cells MC within a memory cell unit MU and a program verification operation is carried out based on the second verification voltage CV. In the process in step S105, a program verification operation is carried out with the second program verification voltage CV to memory cells MC which are not set with program inhibit in step S102, that is, to memory cells MC in which the threshold voltage Vth has not reached the first program verification voltage CVL. Next, the read/program control circuit 51 stores memory cells MC in which the threshold voltage Vth has passed the second program verification voltage CV as [state C2] and these memory cells MC are set at program inhibit (step S106). That is, the program control voltage applied to a bit line BL of these memory cells MC is changed and the memory cells MC are set to a program inhibit state so that the memory cells MC in which the threshold voltage Vth has reached the second program verification voltage CV are not injected with charges by the program voltage Vpgm.

In addition, an example of a threshold voltage distribution when data equivalent to the threshold voltage C is programmed to memory cells by the programming processes in step S105 to step 106 is shown in [step 4] in FIG. 9. This [step 4] in FIG. 9 is a diagram which exemplary shows a distribution state of the threshold voltage Vth when data equivalent to the threshold voltages A, B, C are programmed to a plurality of memory cells MC (cell 1, 2, 3, 4, 5, 6). As is shown by [step 4] in FIG. 9, cells 1, 2, 3, 4, 5 were set as program inhibit in [step 2, 3] in FIG. 9, however, the threshold voltage Vth rises by capacitance coupling with the adjacent memory cell 6. In addition, because the threshold voltage Vth reaches the second program verification voltage CV, cell 4 6 set at program inhibit.

Next, the read/program circuit 51 confirms whether the threshold voltage Vth of all the memory cells MC have passed the first program verification voltages AVL, BVL, CVL or the second program verification voltages AV, BV, CV [program inhibit at states A1, B1, C1 or states A2, B2, C2] (step S107). In the case where the threshold voltage Vth of all the memory cells MC have not passed the first program verification voltages AVL, BVL, CVL or the second program verification voltages AV, BV, CV (step S107: NO), the process shifts to step S108 and supply of the program voltage Vpgm is continued. In addition, In the case where the threshold voltage Vth of all the memory cells MC have passed the first program verification voltage AVL, BVL, CVL or the second program verification voltages AV, BV, CV (step S107: YES), the process shifts to step S109.

In embodiment two, the programming processes in steps S101 to S108 shown above are called 'phase one'.

Next, in step S109, the read/program control circuit 51 resets the memory cells MC (cells 1, 3, 5 in FIG. 9) set to program inhibit in [state A1, B1, C1] in step S102, to program allow. At this time, a voltage which is applied to a word line WL of these memory cells MC is supplied so that charges are injected by the program voltage Vpgm into memory cells MC which are set at program allow.

Next, the second program verification voltages AV, BV, CV are supplied from the row decoder 3 to a word line which is connected to the memory cells MC (cells 1, 3, 5 in FIG. 9) which are set to program allow and a program verification operation is performed based on the second program verification voltages AV, BV, CV (step S110). Next, the read/program control circuit 51 stores memory cells MC in which the threshold voltage Vth has passed the second program verification voltages AV, BV, CV as [state A2, B2, C2] and these memory cells MC are set to program inhibit (step S111). That is, the program control voltage applied to a bit line BL of these memory cells MC is changed and the memory cells MC are set to a program inhibit state so that the memory cells MC in which the threshold voltage Vth has reached the second program verification voltage AV, BV, CV are not injected with charges by the program voltage Vpgm.

Next, the read/program circuit 51 confirms whether the threshold voltage Vth of all the memory cells MC have passed the second program verification voltages AV, BV, CV [program inhibit at states A2, B2, C2] (step S112). In the case where the threshold voltage Vth of all the memory cells MC have not passed the second program verification voltages AV, BV, CV (step S112: NO), the process shifts to step S113 and supply of the program voltage Vpgm is continued. In addition, in the case where the threshold voltage Vth of all the memory cells MC have passed the second program verification voltage AV, BV, CV (step S112: YES), the programming operation is complete.

Figure 10:
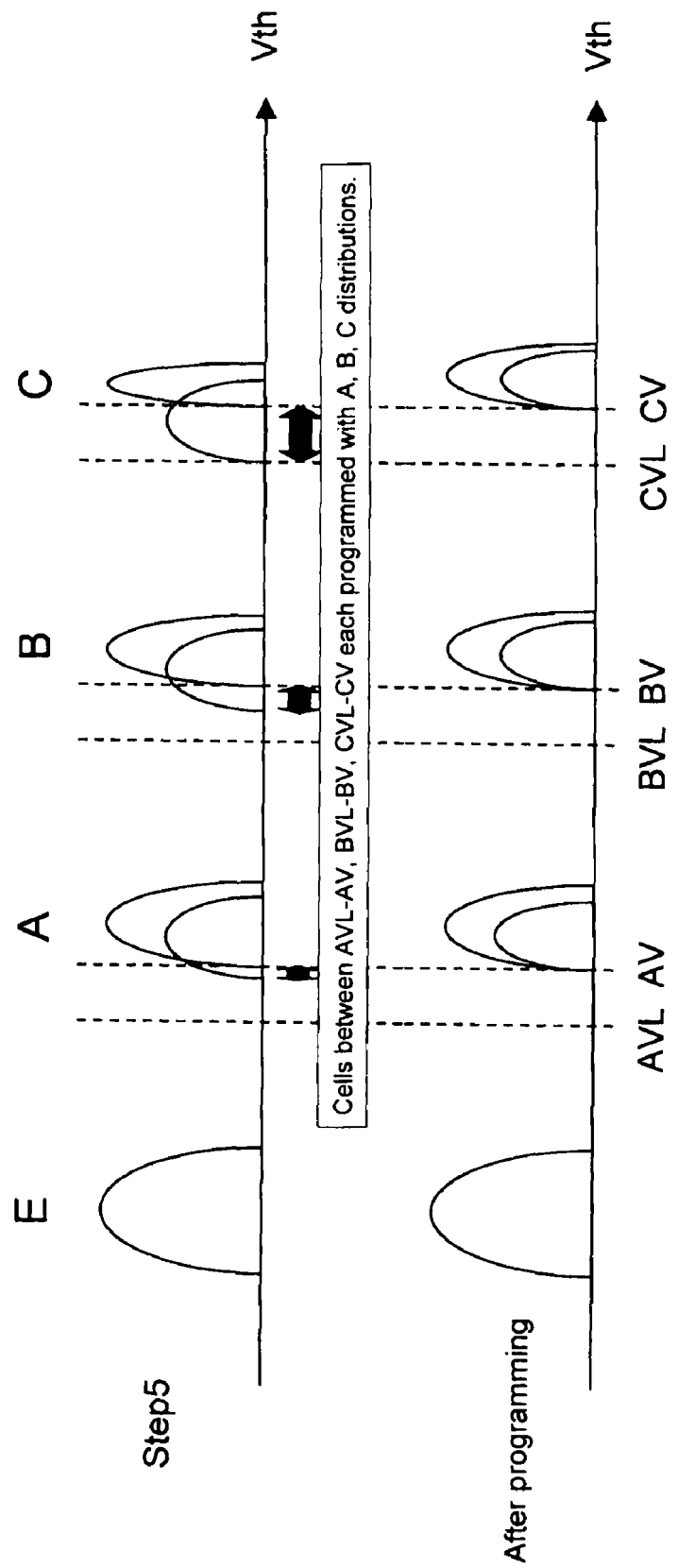
FIG. 10 is a diagram which exemplary shows an example of a threshold voltage distribution of 4 level data which is programmed to a memory cell related to the second embodiment.

An example of a threshold voltage distribution when data equivalent to program verification voltages AVL-AV, program verification voltages BVL-BV and program verification voltages CVL-CV which are programmed to all the memory cells MC (cells 1, 3, 5 in FIG. 9) by the programming processes in step S109 to S113 stated above, is shown in [step 5] in FIG. 10. In addition, an example of a threshold voltage distribution after 4 level data has been programmed is shown as [after programming] in FIG. 10.

In embodiment two, the programming process in steps S109 to S113 shown above is called 'phase two'.

Figure 11:
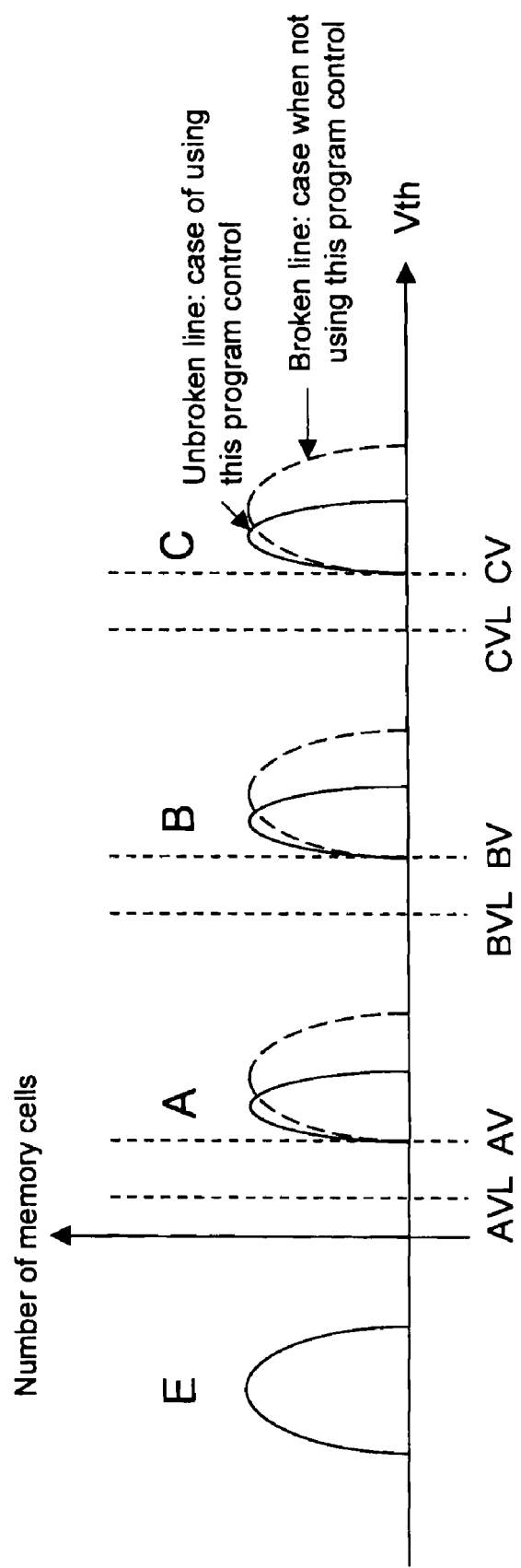
FIG. 11 is a diagram which exemplary shows an example of a threshold voltage distribution of 4 level data which is programmed to a memory cell related to the second embodiment.

As a result of the above programming operation, an example of a threshold voltage distribution after 4 level data has been programmed to memory cells MC is shown in FIG. 11. FIG. 11 is a diagram which exemplary shows an example of a threshold voltage distribution of 4 level data which is programmed to memory cells. As is shown in FIG. 11, the threshold voltage distribution of memory cells which are applied with the programming control shown in FIG. 6 stated above, can be made narrower compared to a threshold voltage distribution of memory cells which are not applied with this programming control.

Figure 12:
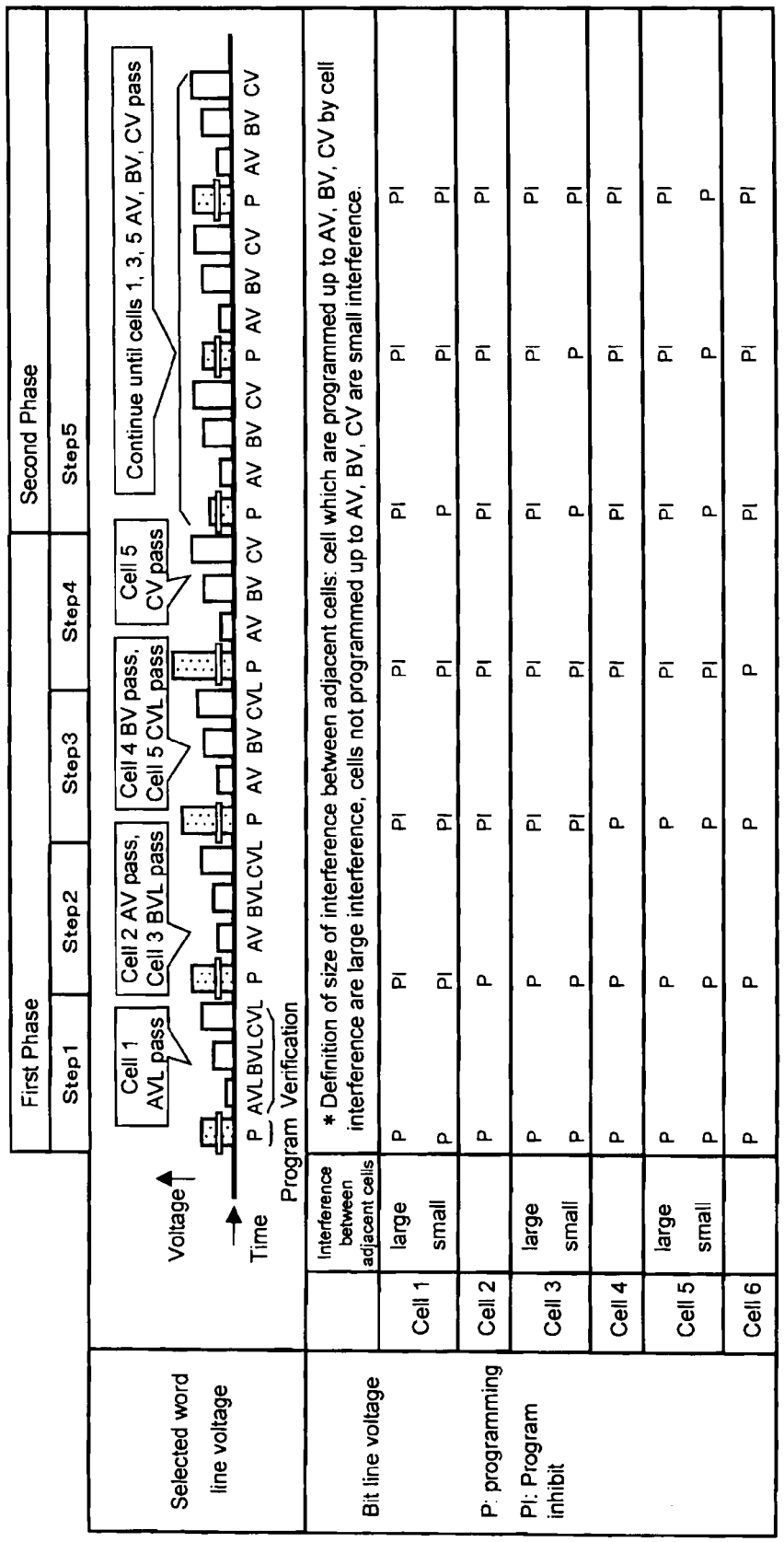
FIG. 12 is a diagram which shows a summary of a programming operation by programming control by the amount of time elapsed related to the second embodiment.

Next, the time elapse of the whole programming operation of 4 level data explained using the flowchart in FIG. 8 and the transition example of the threshold voltage distribution in FIG. 8 to FIG. 10 is shown in FIG. 12. FIG. 12 is a diagram which shows a correlation of aspect of a change in a word line voltage which is applied to cells 1 to 6, and one aspect of a change in a program operation of cells 1 to 6 over time.

In FIG. 12, P shows a program operation being performed, PI shows a program operation being inhibited. In addition, [size of interference between adjacent cells] shown in FIG. 11 is defined as follows. A cell among the cells 1, 3, 5 which reaches a second program verification voltage AV, BV, CV by capacitance coupling (interference between adjacent cells) with adjacent cells in phase one and which does not require programming in phase two, has large interference. A cell among the cells 1, 3, 5 which does not reach a second program verification voltage AV, BV, CV by capacitance coupling (interference between adjacent cells) with adjacent cells in phase one and which requires programming with second programming verification voltages AV, BV, CV in phase two, has small interference.

As is clear from FIG. 12, by applying the program control related to the embodiment two, in the first phase in the diagram (corresponding to step 1 to step 4 stated above) classification of memory cells 1, 3, 5 in which programming speed is fast and memory cells 2, 4, 6 in which programming speed is slow is performed using the first programming verification voltages AVL, BVL, CVL and a program operation of the memory cells 1, 3, 5 is once inhibited. In addition, a programming operation of the memory cells 2, 4, 6 continues using the second verification voltages AV, BV, CV.

Then, in phase two (corresponding to step 2 stated above), the program operation of the memory cells 1, 3, 5 in which a program operation was inhibited is restarted and a program operation continues until the second program verification voltages AV, BV, CV are passed. Furthermore, as is shown in FIG. 12, from first phase shifts to second phase, and when a programming operation is restarted to the memory cells 1, 3, 5 in which programming speed is fast and in which a programming operation was inhibited in first phase, the read/program circuit part 40 once reduces the program voltage Vpgm which his applied to the memory cells 1, 3, 5. That is, the read/program circuit part 40 applies a lower level program voltage Vpgm to the memory cells 1, 3, 5 than the voltage level of the program voltage Vpgm which was applied to the memory cells 1, 3, 5 in first phase, when the phase shifts to second phase. This operation is for preventing over programming and program disturb which is generated in the memory cells 1, 3, 5 in which programming speed is fast.

In this way, in the NAND type flash memory 1 related to embodiment two, in a program control which programs 4 level data, six types of first and second verification voltages AVL, AV, BVL, BV, CVL, CV (AVL<AV<BVL<BV<CVL<CV) are set to three threshold voltage distributions: x=A, B, C. Then, memory cells are categorized into memory cells MC in which programming speed is fast and memory cells MC in which programming speed is slow using the first programming verification voltages AVL, BVL, CVL, and a program operation to a memory cell MC in which programming speed is fast is once inhibited. In addition, programming verification process is continued of memory cells in which programming speed is slow using the second programming verification voltages AV, BV, CV, programming of the memory cells MC to which a program operation was inhibited in again allowed and the programming verification process of all of the memory cells MC is complete.

Therefore, the memory cells in which programming speed is fast and to which a program operation was once inhibited can be programmed using the phenomenon of capacitance coupling between adjacent floating gates FG. As a result, it is possible to reduce over programming of memory cells in which programming speed is fast and reduce the width of a threshold voltage distribution. That is, by shifting a threshold voltage Vth using the phenomenon of capacitance coupling between adjacent floating gates FG, it is possible to gradually perform a program operation of data even to memory cells MC in which programming speed in fast. In addition, in the memory cells MC set with program inhibit using the first program verification voltages AVL, BVL, CVL, it is possible to reduce the widening of the threshold voltage distribution by an amount corresponding to the difference between the first program verification voltages AVL, BVL, CVL and the second program verification voltages AV, BV, CV, by the phenomenon of capacitance coupling between adjacent floating gates FG. Furthermore, in the program control of embodiment two, by categorizing memory cells according to each programming speed, it is possible to set a program voltage which matches the programming speed of each memory cell MC and also improve reliability of a programming operation.

Furthermore, by applying the program control related to embodiment two it is possible to realize a programming operation with a high level of reliability to a NAND type flash memory with an increased number of connected memory cells and progressed miniaturization.

Furthermore, in embodiment two stated above, memory cells are categorized into the memory cells 1, 3, 5 in which programming speed is fast and the memory cells 2, 4, 6 in which programming speed is slow by the first programming verification voltages AVL, BVL, CVL, and a program operation of the memory cells 1, 3, 5 in which programming speed is fast is once inhibited. Then, after programming of each of the memory cells 2, 4, 6 in which programming speed is slow with the threshold voltage Vth of the second programming voltages AV, BV, CV is finished, the memory cells 1, 3, 5 in which programming speed is fast are programmed up to the voltages AV, BV, CV.

The programming sequence described above is not limited to this, for example, after programming of each of the memory cells 2, 4, 6 in which programming speed is slow up to the second programming verification voltages AV, BV, CV is finished, the memory cells 1, 3, 5 in which programming speed is fast may be programmed up to the second programming verification voltages AV, BV, CV. In addition, the memory cells 2, 4, 6 in which programming speed is slow and the memory cells 1, 3, 5 in which programming speed is fast may be programmed alternately up to the second programming verification voltages AV, BV, CV such as memory cell 2, memory cell 1, memory cell 4, memory cell 3, memory cell 6, memory cell 5. By changing the programming sequence in this way, it is possible to further reduce interference between adjacent cells.

Third Embodiment

In the third embodiment, the case where the NAND type flash memory 1 is programmed with 8 level data will be explained. Furthermore, because the structure of the NAND type flash memory 1 related to the third embodiment is the same as that in FIG. 1 to FIG. 4, a structural explanation will be omitted here.

A program operation of 8 level data which is performed in the NAND type flash memory 1 of the third embodiment will be explained while referring to the flowchart shown in FIG. 13 and the transition diagram of the threshold voltage distribution shown in FIG. 14 and FIG. 15. In the flowchart shown in FIG. 13, fourteen types of program verification voltages A1VL, A1V, A2VL, A2V, B2VL, B2V, C2VL, C2V, A3V, B3V, D3V, E3V, F3V, G3V used in a program verification control, are set as parameters related to a program control of the third embodiment for everything shown by a threshold voltage distribution: x=A, B, C, D, E, F, G. The relationships between these voltages is A3V<A2VL<A2V<B3V<A1VL<A1V<C3V<B2VL<B2V <D3V <C2VL<C2V<E3V<F3V<G3V.

Figure 13:
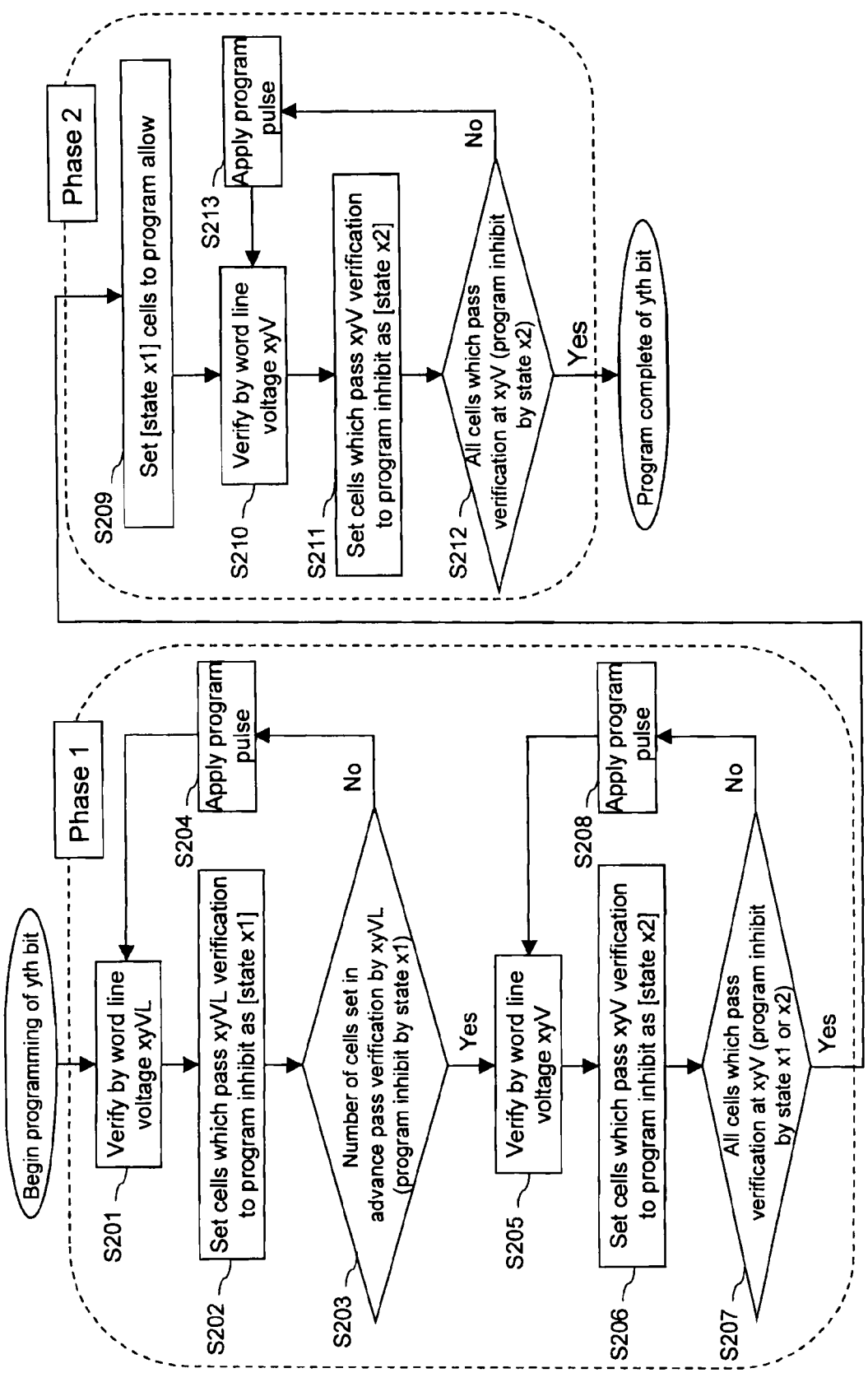
FIG. 13 is a flowchart which shows a programming operation which is performed in a NAND type flash memory related to a third embodiment.

In addition, in the flowchart shown in FIG. 13, the case where data in the order 2 level data→4 level data→8 level data is programmed to a memory cell MC is explained. In order to control this programming order, parameters x, y are set in the flowchart shown in FIG. 13. A symbol which shows a threshold voltage distribution is set to the parameter x. In the case of programming 2 level data, only [x=A] is set. In the case of programming 4 level data, [x=A, B, C] is set. And in the case of programming 8 level data [x=A, B, C, D, E, F, G] is set. The number of bits which correspond to 2 level data, 4 level data and 8 level data which are programmed is set to the parameter y. In the case of programming 2 level (1 bit) data, [y=1] is set. In the case of programming 4 level (2 bits) data, [y=2] data is set. And in the case of programming 8 level (3 bits) data, [y=3] is set.

In addition, in the flowchart shown in FIG. 13, state x1, x2 is set as a parameter which shows the state of a threshold voltage distribution of memory cells MC (in the case of a structure in which a memory circuit (buffer etc) is arranged for each memory cell and data is stored). [x=A, B, C, D, E, F, G] which corresponds to 2 level data, 4 level data and 8 level data stated above, is set to these states x1 and x2.

In addition, in program control of 8 level data related to the third embodiment, program verification voltages A1VL, A2VL, B2VL, C2VL are given as first program verification voltages A1VL, A2VL, B2VL, C2VL, and program verification voltages A1V, A2V, B2V, C2V, A3V, B3V, C3V, E3V, F3V, G3V are given as second program verification voltages A1V, A2V, B2V, C2V, A3V, B3V, D3V, E3V, F3V, G3V. The first program verification voltages A1VL, A2VL, B2VL, C2VL are voltages for categorizing memory cells MC among the plurality of memory cells within the memory cell array 2 into memory cells in which programming speed is fast and memory cells in which programming speed is slow. The second program verification voltages A1V, A2V, B2V, C2V, A3V, B3V, D3V, E3V, F3V, G3V are voltages for determining a potential at the bottom of the threshold voltage distribution: x=A, B, C, D, E, F, G. The first program verification voltages A1VL, A2VL, B2VL, C2VL and the second program verification voltages A1V, A2V, B2V, C2V, A3V, B3V, D3V, E3V, F3V, G3V are set by the read/program control circuit 51. The read/program control circuit 51 controls the row decoder 3 and supplies at appropriates times the first program verification voltages A1VL, A2VL, B2VL, C2VL and the second program verification voltages A1V, A2V, B2V, C2V, A3V, B3V, D3V, E3V, F3V, G3V to a word line WL when a program operation of 8 level data shown below is carried out.

In FIG. 13, first, when a program operation of 2 level data begins, that is, when the program voltage Vpgm is supplied from the read/program circuit part 40 to a bit line BL which is connected to a memory cell unit MU to be programmed, the threshold voltage of memory cells rises gradually in order from the memory cell in which programming speed is fast. Next, the first program verification voltage A1VL is supplied from the row decoder 3 to a word line WL which is connected to memory cells MC within a memory cell unit MU, an a program verification operation is carried out based on the first program verification voltage A1VL (step S201). The read/program control circuit 51 stores memory cells MC in which the threshold voltage Vth has passed the first verification voltage A1VL as [state A1] and also sets this memory cells MC to program inhibit (step S202). That is, the memory cells MC in which the threshold voltage Vth has reached the first verification voltage A1VL, the program control voltage which is applied to a bit line BL of these memory cells MC is changed and the memory cells are set to a program inhibit state so that charges are not injected by the program voltage Vpgm.

Next, the read/program control circuit 51 confirms whether the threshold voltage Vth of the number of memory cells set in advance has passed the first verification voltage A1VL (program inhibit at [state A1]) (step S203). In the case where the threshold voltage Vth of the number of memory cells set in advance has not passed the first verification voltage A1VL (step S203: NO), the process shifts to step S204 and supply of the program voltage Vpgm is continued. In addition, in the case where the threshold voltage Vth of the number of memory cells set in advance has passed the first verification voltage A1VL (step S203: YES) the process shifts to step S205.

An example of a threshold voltage distribution when 2 level data equivalent to the threshold voltage A is programmed to memory cells MC by the programming processes in steps S201 to S203 stated above is shown as [one bit (2 levels) programming Step 1-1] in FIG. 14. This diagram is a diagram which exemplary shows the distribution state of the threshold voltage Vth when 2 level data equivalent to the threshold voltage A is programmed to a plurality of memory cells MC (cells 1-1, 2-2). As is shown by [first bit (2 levels) programming Step 1] In FIG. 14, among the cells 1-1, 1-2 which are programmed with 2 levels data equivalent to the threshold voltage A, the memory cell 1-1 on the right half side in which the threshold voltage Vth has reached the first program verification voltage A1VL is set at program inhibit and the memory cell 1-2 on the left half side in which the threshold voltage Vth has not reached the first program verification voltage A1VL continues to be programmed.

Next, in step S205 the read/program control circuit 51 switches the setting of the program verification voltage from the first program verification voltage A1VL to the second program verification voltage A1V. As a result, the second program verification voltage A1V is supplied from the row decoder 3 to a word line WL connected to memory cells MC within a memory cell unit MU and a program verification operation is carried out based in the second program verification voltage A1V. In the process in step S205, a program verification operation is performed by the second program verification voltage A1V to memory cells MC which were not set as program inhibit in step S202, that is, to memory cells MC in which the threshold voltage Vth does not reach the first program verification voltage A1VL. These memory cells MC are denoted as memory cells MC in which programming speed is slow in the third embodiment.

Next, the read/program control circuit 51 stores memory cells MC in which the threshold voltage Vth has passed the second program verification voltage A1V as [state A2] and sets these memory cells MC to program inhibit (step S206). That is, in the memory cells MC in which the threshold voltage Vth has reached the second verification voltage A1V, the program control voltage which is applied to a bit line BL of this memory cells MC is changed and the memory cells are set to a program inhibit state so that charges are not injected by the program voltage Vpgm.

An example of a threshold voltage distribution when 2 level data equivalent to the threshold voltage A is programmed to memory cells MC by the programming processes in steps S205 to S206 stated above is shown as [first bit (2 levels) programming Step 1-2] in FIG. 14. This [first bit (2 levels) programming Step 1-2] is a diagram which exemplary shows the distribution state of the threshold voltage Vth when 2 level data equivalent to the threshold voltage A is programmed to a plurality of memory cells MC (cells 1-1, 2-2). As is shown by [first bit (2 levels) programming Step 1-2] In FIG. 14, the memory cell 1-1 in was set at program inhibit in [Step 1-1] however, the threshold voltage Vth increases due to capacitance coupling with the adjacent cell 1-2. In addition, because the threshold voltage Vth has reached the second program verification voltage A1V, the cell 1-2 is set at program inhibit.

Next, the read/program control circuit 51 confirms whether the threshold voltage Vth of all memory cells MC in which programming speed is slow has passed the second verification voltage A1V (program inhibit at [state A1] or [state A2]) (step S207). In the case where the threshold voltage Vth of all memory cells MC in which programming speed is slow has not passed the second verification voltage A1V (step S207: NO), the process shifts to step S208 and supply of the program voltage Vpgm is continued. In addition, in the case where the threshold voltage Vth of all memory cells in which programming speed is slow has passed the second verification voltage A1V (step S207: YES) the process shifts to step S209.

In the third embodiment, the programming process in steps S201 to S208 shown above is called 'phase one'.

Next, in step S209, the read/program control circuit 51 again sets the memory cell MC (cell 1-1) which was set to program inhibit by [state A1] in step S202 to program allow. At this time, the voltage which is applied to a bit line BL of this memory cell MC is supplied to this memory cell MC which is set to program allow so that charges are injected by the program voltage Vpgm.

Next, the second verification voltage A1V is supplied from the row decoder 3 to a word line WL which is connected to the memory cell (cell 1-1) which was set to program allow and a program verification operation is performed based on the second program verification voltage A1V (step S210). Next, the read/program control circuit 51 stores the memory cell MC in which the threshold voltage Vth has passed the second program verification voltage A1V as [state A2] and sets this memory cell MC as program inhibit (step S211). That is, the program control voltage which is applied to a bit line BL of this memory cell MC is changed and this memory cell MC in which the threshold voltage Vth has reached the second program verification voltage A1V, is set to a program inhibit state so that charges are not injected by the program voltage Vpgm.

Next, the read/program control circuit 51 confirms whether the threshold voltage Vth of all memory cells MC has passed the second program verification voltage A1V (program inhibit at [state A2]) (step S212). In the case where the threshold voltage Vth of all memory cells MC has not passed the second verification voltage A1V (step S212: NO), the process shifts to step S213 and supply of the program voltage Vpgm is continued. In addition, in the case where the threshold voltage Vth of all memory cells MC has passed the second verification voltage A1V (step S212: YES) the program operation is complete.

An example of a threshold voltage distribution when data equivalent to between the program verification voltages A1VL-A1V is programmed to all the memory cells MC (cell 1-1, 1-2) by the programming processes in steps S209 to S213 stated above is shown as [first bit (2 levels) programming Step 1-3] in FIG. 14. As is shown in [Step 1-3] in FIG. 14, the width of a threshold voltage distribution after memory cells MC have been programmed with 2 level data can be reduced.

In the third embodiment, the programming process in steps S209 to S213 shown above is called 'phase two'.

Next, a program operation of 4 level (2 bits) data following on from a program operation of 2 level (1 bit) data stated above will be explained while referring to the flowchart shown in FIG. 13 and a transition diagram of the threshold voltage distribution shown in FIG. 15.

In FIG. 13, first, when a program operation of 4 level data begins, that is, when a program control voltage which allows programming is supplied from the read/program circuit part 40 to a bit line BL which is connected to a memory cell unit MU to be programmed, the threshold voltage of memory cells rises gradually in order from the memory cells in which programming speed is fast when the program voltage Vpgm is supplied to a word line WL which is connected to the memory cells MC. Next, the first program verification voltages A2VL, B2VL, C2VL are supplied from the row decoder 3 to a word line WL which is connected to memory cells MC within a memory cell unit MU, and a program verification operation is carried out based on the first program verification voltage A2VL, B2VL, C2VL (step S201). The read/program control circuit 51 stores memory cells MC in which the threshold voltage Vth has passed the first verification voltages A2VL, B2VL, C2VL as [state A1, B1, C1] and also sets these memory cells MC to program inhibit (step S202). That is, in the memory cells MC in which the threshold voltage Vth has reached the first program verification voltages A2VL, B2VL, C2VL, the program control voltage which is applied to a bit line BL of this memory cells MC is changed and the memory cells are set to a program inhibit state so that charges are not injected by the program voltage Vpgm.

Next, the read/program control circuit 51 confirms whether the threshold voltage Vth of the number of memory cells set in advance has passed the first program verification voltages A2VL, B2VL, C2VL (program inhibit at [state A1, B1, C1]) (step S203). In the case where the threshold voltage Vth of the number of memory cells set in advance has not passed the first program verification voltages A2VL, B2VL, C2VL (step S203: NO), the process shifts to step S204 and supply of the program voltage Vpgm is continued. In addition, in the case where the threshold voltage Vth of the number of memory cells set in advance has passed the first program verification voltage A2VL, B2VL, C2VL (step S203: YES) the process shifts to step S205.

An example of a threshold voltage distribution when 4 level data equivalent to the threshold voltages A, B, C is programmed to memory cells MC by the programming processes in steps S201 to S203 stated above is shown as [second bit (4 levels) programming Step 2-1] in FIG. 15. This diagram is a diagram which exemplary shows the distribution state of the threshold voltage Vth when 4 level data equivalent to the threshold voltages A, B, C are programmed to a plurality of memory cells MC (cells 2-1, 2-2, 2-3, 2-4, 2-5, 2-6). As is shown by [second bit (4 levels) programming Step 2-1] In FIG. 15, among the cells 2-1, 2-2, 2-3, 2-4, 2-5, 2-6 which are programmed with 4 levels data equivalent to the threshold voltage A, B, C, the memory cells 2-1, 2-3, 2-5 on the right half side in which the threshold voltage Vth has reached the first program verification voltages A2VL, B2VL, C2VL is set to program inhibit and the memory cells 2-2, 2-4, 2-6 on the left half side in which the threshold voltage Vth has not reached the first program verification voltages A2VL, B2VL, C2VL continues to be programmed.

Next, in step S205 the read/program control circuit 51 switches the setting of the program verification voltage from the first program verification voltages A2VL, B2VL, C2VL to the second program verification voltages A2V, B2V, C2V. As a result, the second program verification voltages A2V, B2V, C2V are supplied from the row decoder 3 to a word line WL connected to memory cells MC within a memory cell unit MU and a program verification operation is carried out based on the second program verification voltages A2V, B2V, C2V. In the process in step S205, a program verification operation is performed using the second program verification voltages A2V, B2V, C2V to memory cells MC which were not set as program inhibit in step S202, that is, to memory cells MC in which the threshold voltage Vth does not reach the first program verification voltages A2VL, B2VL, C2vL. These memory cells MC are denoted as memory cells MC in which programming speed is slow in the third embodiment.

Next, the read/program control circuit 51 stores memory cells MC in which the threshold voltage Vth has passed the second program verification voltages A2V, B2V, C2V as [state A2, B2, C2] and sets these memory cells MC to program inhibit (step S206). That is, in the memory cells MC in which the threshold voltage Vth has reached the second verification voltages A2V, B2V, C2V the program control voltage which is applied to a bit line BL of this memory cells MC is changed and the memory cells are set to a program inhibit state so that charges are not injected by the program voltage Vpgm.

An example of a threshold voltage distribution when 4 level data equivalent to the threshold voltages A, B, C is programmed to memory cells MC by the programming processes in steps S205 to S206 stated above is shown as [second bit (4 levels) programming Step 2-2] in FIG. 15. [second bit (4 levels) programming Step 2-2] in this diagram is a diagram which exemplary shows the distribution state of the threshold voltage Vth when 4 level data equivalent to the threshold voltages A, B, C are programmed to a plurality of memory cells MC (cells 2-1, 2-2, 2-3, 2-4, 2-5, 2-6). As is shown by [second bit (4 levels) programming Step 2-2] In FIG. 15, the memory cells 2-1, 2-3, 2-5 were set to program inhibit in [Step 2-1], however, the threshold voltage Vth increases due to capacitance coupling with the adjacent cells 2-2, 2-4, 2-6. In addition, because the threshold voltage Vth has reached the second program verification voltages A2V, B2V, C2V, the cells 2-2, 2-4, 2-6 are set at program inhibit.

Next, the read/program control circuit 51 confirms whether the threshold voltage Vth of all memory cells MC in which programming speed is slow has passed the second program verification voltages A2V, B2V, C2V (program inhibit at [state A1, B1, C1] or [state A2, B2, C2]) (step S207). In the case where the threshold voltage Vth of all memory cells MC in which programming speed is slow has not passed the second program verification voltages A2V. B2V, C2V (step S207: NO), the process shifts to step S208 and supply of the program voltage Vpgm is continued. In addition, in the case where the threshold voltage Vth of all memory cells in which programming speed is slow has passed the second program verification voltages A2V, B2V, C2V (step S207: YES), the process shifts to step S209.

Next, in step S209, the read/program control circuit 51 again sets the memory cells MC (cell 2-1, 2-3, 2-5) which were set to program inhibit by [state A1, B1, C1] in step S202 to program allow. At this time, the voltage which is applied to a word line WL of these memory cells MC is supplied to these memory cells MC which were set to program allow so that charges are injected by the program voltage Vpgm.

Next, the second program verification voltages A2V, B2V, C2V are supplied from the row decoder 3 to a word line WL connected to the memory cells MC (cells 2-1, 2-3, 2-5) which were set to program allow and a program verification operation is performed based on the second program verification voltages A2V, B2V, C2V (step S210). Next, the read/program control circuit 51 stores the memory cells MC in which the threshold voltage Vth has passed the second program verification voltages A2V, B2V, C2V as [state A2, B2, C2] and sets these memory cells to program inhibit (step S211). That is, in the memory cells MC in which the threshold voltage Vth has reached the second verification voltages A2V, B2V, C2V the program control voltage which is applied to a bit line BL of this memory cells MC is changed and the memory cells are set to a program inhibit state so that charges are not injected by the program voltage Vpgm.

Next, the read/program control circuit 51 confirms whether the threshold voltage Vth of all memory cells MC have passed the second program verification voltages A2V, B2V, C2V (program inhibit at [state A2]) (step S212). In the case where the threshold voltage Vth of all memory cells MC has not passed the second program verification voltages A2V, B2V, C2V (step S212: NO), the process shifts to step S213 and supply of the program voltage Vpgm is continued. In addition, in the case where the threshold voltage Vth of all memory cells MC has passed the second program verification voltages A2V, B2V, C2V (step S212: YES), the program operation is complete.

An example of a threshold voltage distribution when data equivalent to between the program verification voltages A2VL-A2V, the program verification voltages B2VL-B2V, the program verification voltages C2VL-C2V, is programmed to all the memory cells MC (cells 2-1, 2-3, 2-5) by the programming processes in steps S209 to S213 stated above is shown as [second bit (4 levels) programming Step 2-3] in FIG. 15. As is shown in [Step 2-3] in FIG. 15, the width of a threshold voltage distribution after a memory cell MC has been programmed with 4 level data can be reduced.

As stated above, by applying program control base on the flow chart shown in FIG. 13 in the case where 8 level data is programmed and in the case where 2 level data and 4 level data are programmed, it is possible to reduce the width of a threshold voltage distribution until the time 4 level data is programmed. As a result, the process continues with a programming operation of 8 level data, however, the program control based on the flowchart shown in FIG. 13 is not applied.

Next, a program operation 8 levels (3 bits) data performed following form a program operation of 4 levels (2 bit) data described above will be explained while referring to a transition diagram of the threshold voltage distribution shown in FIG. 15.

When a programming operation of 8 levels data begins, that is, the program voltage Vpgm is supplied from the read/program circuit part 40 to a bit line BL which is connected to a memory cell unit MU to be programmed. Next, the second program verification voltage A3V, B3V, C3V, D3V, E3V, F3V, G3V are supplied from the row decoder 3 to a word line WL which is connected to memory cells MC within a memory cell unit MU, and a program verification operation is performed based on the second program verification voltages A3V, B3V, C3V, D3V, E3V, F3V, G3V.

Then, when the threshold voltage Vth of all the memory cells MC (cells 3-1 to 3-14) has passed the second program verification voltages A3V, B3V, C3V, D3V, E3V, F3V, G3V, the programming operation of 8 levels data is complete. As a result, as is shown in [3 bits (8 level) data programming Step 3] in FIG. 15, the programming of 8 levels data corresponding to the threshold voltages A, B, C, D, E, F, G, is complete.

As stated above, in the NAND type flash memory 1 related to the third embodiment, in program control for programming 8 levels data, first, a program verification operation of 2 level data set with the first and second program verification voltages A1VL and A1V is performed. Next, a program verification operation of 4 levels data set with the first program verification voltages A2VL, B2VL, C2VL and the second program verification voltages A2V, B2V, C2V is performed. By performing these program verification operations related to 2 levels data and 4 levels data first, memory cells MC in which programming speed is fast and memory cells MC in which programming speed is slow are categorized. Then, a programming operation of memory cells MC in which programming speed is fast is once inhibited, then a program verification process of memory cells MC in which programming speed is slow is continued using the second program verification voltages, the memory cells MC to which a program operation was inhibited is again allowed and then the program verification operation of all the memory cells MC is complete. As a result, it is possible to reduce the width of a threshold voltage distribution of each memory cell when programming of 4 levels data is complete. Then, even if a program control the same as that for 2 levels and 4 levels data is not applied, it is possible to reduce the width of a threshold voltage distribution after a program operation of 8 levels data is complete by performing a program verification operation of 8 levels data set with the second program verification voltages A3V, B3V, C3V, D3V, E3V, F3V, E3V, G3V.

Therefore, it is possible to program memory cells MC in which programming speed is fast and to which programming is once inhibited using the phenomenon of capacitance coupling between floating gates FG. As a result, it is possible to reduce over programming of memory cells in which programming speed is fast and also reduce the width of a threshold voltage distribution. That is, it becomes possible to gradually perform a programming operation of data to memory cells MC in which programming speed is fast by shifting a threshold voltage Vth using the phenomenon of capacitance coupling between floating gates FG. In addition, in memory cells MC set at program inhibit using the first program verification voltages, widening of a threshold voltage distribution due to the phenomenon of capacitance coupling between floating gates FG can be reduced by an amount corresponding to the difference between the first program verification voltages and the second program verification voltages. Furthermore, in program control related to the third embodiment, by categorizing memory cells MC by each programming speed, it is possible to set a program voltage which matches the programming speed of each memory cell MC and also improve the reliability of a programming operation.

Furthermore, by applying the program control related to the third embodiment, it is possible to realize a highly reliable programming operation to a NAND type flash memory in which miniaturization, significant Increases in the number of connections of memory cells and the multi-level of data which are stored are progressing.

Furthermore, in the third embodiment, program control for 8 level data was shown as an example, however, it is also possible to apply the above stated program control in the same way for 16 level data. Program control of 16 level data can be realized simply by applying the parameters [x, y] set in the flowchart shown in FIG. 13 and changing the setting of the first and second program verification voltages for use with 16 levels. In addition, in the case of program control of 8 level data or 16 level data, it is possible to reduce the number of memory circuits which store the states of memory cells MC during a programming operation by applying the above stated program control.

What is claimed is:

1. A nonvolatile semiconductor memory device comprising:
   a plurality of electrically reprogrammable memory cells;
   a read/program circuit, said read/program circuit programming desired data to said plurality of memory cells by supplying a program voltage and a program verification voltage, supplying a first program verification voltage to said plurality of memory cells when programming said data, and supplying a second program verification voltage which has a different voltage level to said first program verification voltage to said plurality of memory cells; and
   a read/program control circuit which determines memory cells which reach a first data program state and memory cells which do not reach said first data program state when said first program verification voltage is supplied, and which determines memory cells which reach a second data program state and memory cells which do not reach said second data program state when said second program verification voltage is supplied, and changes a programming operation state of each memory cell of said plurality of memory cells based on a result of each determination.

2. The nonvolatile semiconductor memory device according to claim 1, wherein said read/program control circuit changes a voltage level of said program control voltage which is supplied to memory cells which have reached said first data program state and inhibits data programming, continues supplying said program control voltage to memory cells which have not reached said first data program state and continues data programming.

3. The nonvolatile semiconductor memory device according to claim 1, wherein said read/program control circuit changes a voltage level of said program control voltage which is supplied to memory cells which have reached said second data program state and inhibits data programming, continues supplying said program control voltage to memory cells which have not reached said second data program state and continues data programming.

4. The nonvolatile semiconductor memory device according to claim 1, wherein said read/program circuit applies a program voltage which has a lower level than a voltage level of a program voltage applied to memory cells before inhibiting said data programming when data programming begins again to said memory cells to which said data programming is inhibited.

5. The nonvolatile semiconductor memory device according to claim 1, wherein said read/program control circuit sets said first program verification voltage and categorizes memory cells which reach said first data programming state as memory cells in which programming is fast, and memory cells which do not reach said first data programming state as memory cells in which programming is slow among said plurality of memory cells using said first program verification voltage.

6. The nonvolatile semiconductor memory device according to claim 1, wherein said read/program control circuit sets said second program verification voltage and determines the bottom of a threshold voltage distribution of said plurality of memory cells based on said second program verification voltage.

7. The nonvolatile semiconductor memory device according to claim 1, wherein said read/program control circuit stores memory cells which reach said first data program state as a first state and sets said memory cells to program inhibit, continues to supply said program control voltage to memory cells which do not reach said first data program state and continues data programming.

8. The nonvolatile semiconductor memory device according to claim 1, wherein said read/program control circuit stores memory cells which reach said second data program state as a second state and sets said memory cells to program inhibit, continues to supply said program control voltage to memory cells which do not reach said second data program state and continues data programming.

9. The nonvolatile semiconductor memory device according to claim 7, wherein said read/program control circuit confirms that among said plurality of memory cells, memory cells set to said program inhibit are stored as said first state and resets said memory cells to program allow.

10. The nonvolatile semiconductor memory device according to claim 1, wherein a value of said first program verification voltage is set at a lower value than a value of said second program verification voltage.

11. The nonvolatile semiconductor memory device according to claim 1, wherein said read/program control circuit sets a plurality of threshold voltages corresponding to multi-level data which is programmed to said plurality of memory cells, and sets a plurality of said first program verification voltages and a plurality of said second program verification voltages based on said plurality of threshold voltages.

12. The nonvolatile semiconductor memory device according to claim 11, wherein said read/program control circuit categorizes memory cells which reach said first data programming state as said memory cells in which programming is fast, and memory cells which do not reach said first data programming state as said memory cells in which programming is slow among said plurality of memory cells when controlling a program verification operation of said plurality of memory cells using said plurality of said first program verification voltages.

13. The nonvolatile semiconductor memory device according to claim 11, wherein said read/program control circuit determines the bottom of a plurality of threshold voltage distributions corresponding to said multi-level data of said plurality of memory cells based on said plurality of said second program verification voltages.

14. The nonvolatile semiconductor memory device according to claim 11, wherein said read/program control circuit stores memory cells which reach said first data program state as a first state and sets said memory cells to program inhibit, continues to supply said program control voltage to memory cells which do not reach said first data program state and continues data programming when controlling a program verification operation of said plurality of memory cells using said plurality of said first program verification voltages.

15. The nonvolatile semiconductor memory device according to claim 11, wherein said read/program control circuit stores memory cells which reach said second data program state as a second state and sets said memory cells to program inhibit, continues to supply said program control voltage to memory cells which do not reach said second data program state and continues data programming when controlling a program verification operation of said plurality of memory cells using said plurality of said second program verification voltages.

16. The nonvolatile semiconductor memory device according to claim 14, wherein said read/program control circuit confirms that among said plurality of memory cells, memory cells set to said program inhibit are stored as said first state and resets this memory cell to program allow.

17. A method of controlling a nonvolatile semiconductor memory device which includes a plurality of electrically reprogrammable memory cells, said method comprising:
programming desired data by supplying a program voltage and a program verification voltage to said plurality of memory cells;
supplying a first program verification voltage to said plurality of memory cells when programming said data;
supplying to said plurality of memory cells a second program verification voltage which has a different level to said first program verification voltage:
determining memory cells which reach a first data program state and memory cells which do not reach said first data program state when supplying said first program verification voltage;
determining memory cells which reach a second data program state and memory cells which do not reach said second data program state when supplying said second program verification voltage; and
supplying a program control voltage which changes a programming operation state of each memory cell based on a result of each of said determinations.

18. The method of controlling a nonvolatile semiconductor memory device according to claim 17, wherein a voltage level of said program control voltage which is supplied to memory cells which reach said first data program state is changed and data programming is inhibited, the supply of said program control voltage being continued to memory cells which do not reach said first data program state and data programming is continued.

19. The method of controlling a nonvolatile semiconductor memory device according to claim 17, wherein a voltage level of said program control voltage which is supplied to memory cells which reach said second data program state is changed and data programming is inhibited, the supply of said program control voltage being continued to memory cells which do not reach said second data program state and data programming is continued.

20. The method of controlling a nonvolatile semiconductor memory device according to claim 17, wherein at the time of restarting data programming to memory cells which are set to said data program inhibit, a program voltage of a lower level than a voltage level of a program voltage which is applied to said memory cells is applied before setting said data program inhibit.

* * * * *